(12) United States Patent
Nagao et al.

(10) Patent No.: US 7,297,579 B2
(45) Date of Patent: Nov. 20, 2007

(54) SEMICONDUCTOR DEVICE AND MANUFACTURING METHOD THEREOF

(75) Inventors: Ritsuko Nagao, Atsugi (JP); Masahiko Hayakawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/518,433

(22) Filed: Sep. 11, 2006

(65) Prior Publication Data

US 2007/0010047 A1   Jan. 11, 2007

Related U.S. Application Data

(62) Division of application No. 10/123,250, filed on Apr. 17, 2002, now Pat. No. 7,112,844.

(30) Foreign Application Priority Data

Apr. 19, 2001 (JP) ............................. 2001-121819

(51) Int. Cl.
*H01L 21/266* (2006.01)
(52) U.S. Cl. ...................... 438/163; 438/549; 438/151; 438/529; 438/286; 257/72
(58) Field of Classification Search ................ 438/151, 438/163, 286, 529, 546, 548, 549; 257/72
See application file for complete search history.

(56) References Cited

U.S. PATENT DOCUMENTS 4,804,637 A    2/1989  Smayling et al.
5,210,435 A    5/1993  Roth et al.
5,412,493 A    5/1995  Kunii et al.
5,830,787 A   11/1998  Kim
6,140,688 A   10/2000  Gardner et al.
6,172,399 B1   1/2001  Lee et al.
6,204,534 B1   3/2001  Adan
6,225,669 B1   5/2001  Long et al.

(Continued)

FOREIGN PATENT DOCUMENTS

EP          1 006 589       6/2000

(Continued)

*Primary Examiner*—Matthew C. Landau
(74) *Attorney, Agent, or Firm*—Eric J. Robinson; Robinson Intellectual Property Law Office, P.C.

(57) ABSTRACT

The objectives of the present invention are achieving TFTs having a small off current and TFT structures optimal for the driving conditions of a pixel portion and driver circuits, and providing a technique of making the differently structured TFTs without increasing the number of manufacturing steps and the production costs. A semiconductor device has a semiconductor layer, a gate insulating film on the semiconductor layer, and a gate electrode on the gate insulating film. The semiconductor layer contains a channel forming region, a region containing a first concentration impurity element, a region containing a second concentration impurity element, and a region containing a third concentration impurity element. The gate electrode is formed by laminating an electrode (A) and an electrode (B). One edge portion of the electrode (A) overlaps with the region containing the second concentration impurity element, through the gate insulating film, and another edge portion of the electrode (A) overlaps with the channel forming region, through the gate insulating film.

9 Claims, 16 Drawing Sheets

U.S. PATENT DOCUMENTS

| | | |
|---|---|---|
| 6,246,180 B1 | 6/2001 | Nishigaki |
| 6,259,138 B1 | 7/2001 | Ohtani et al. |
| 6,274,887 B1 | 8/2001 | Yamazaki et al. |
| 6,303,963 B1 | 10/2001 | Ohtani et al. |
| 6,306,694 B1 | 10/2001 | Yamazaki et al. |
| 6,353,245 B1 | 3/2002 | Unnikrishnan |
| 6,365,917 B1 | 4/2002 | Yamazaki |
| 6,399,988 B1 | 6/2002 | Yamazaki |
| 6,420,758 B1 | 7/2002 | Nakajima |
| 6,469,317 B1 | 10/2002 | Yamazaki et al. |
| 6,498,369 B1 | 12/2002 | Yamazaki et al. |
| 6,501,098 B2 | 12/2002 | Yamazaki |
| 6,501,466 B1 | 12/2002 | Yamagishi et al. |
| 6,512,271 B1 | 1/2003 | Yamazaki et al. |
| 6,512,504 B1 | 1/2003 | Yamauchi et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,534,826 B2 | 3/2003 | Yamazaki |
| 6,541,294 B1 | 4/2003 | Yamazaki et al. |
| 6,545,359 B1 | 4/2003 | Ohtani et al. |
| 6,599,785 B2 | 7/2003 | Hamada et al. |
| 6,646,287 B1 | 11/2003 | Ono et al. |
| 6,664,145 B1 | 12/2003 | Yamazaki et al. |
| 6,909,114 B1 | 6/2005 | Yamazaki |
| 2003/0020413 A1 | 1/2003 | Oomura |

FOREIGN PATENT DOCUMENTS

| | | |
|---|---|---|
| JP | 06-265940 | 9/1994 |
| JP | 06-349856 | 12/1994 |
| JP | 3072655 | 7/2000 |
| JP | 2000-228527 | 8/2000 |

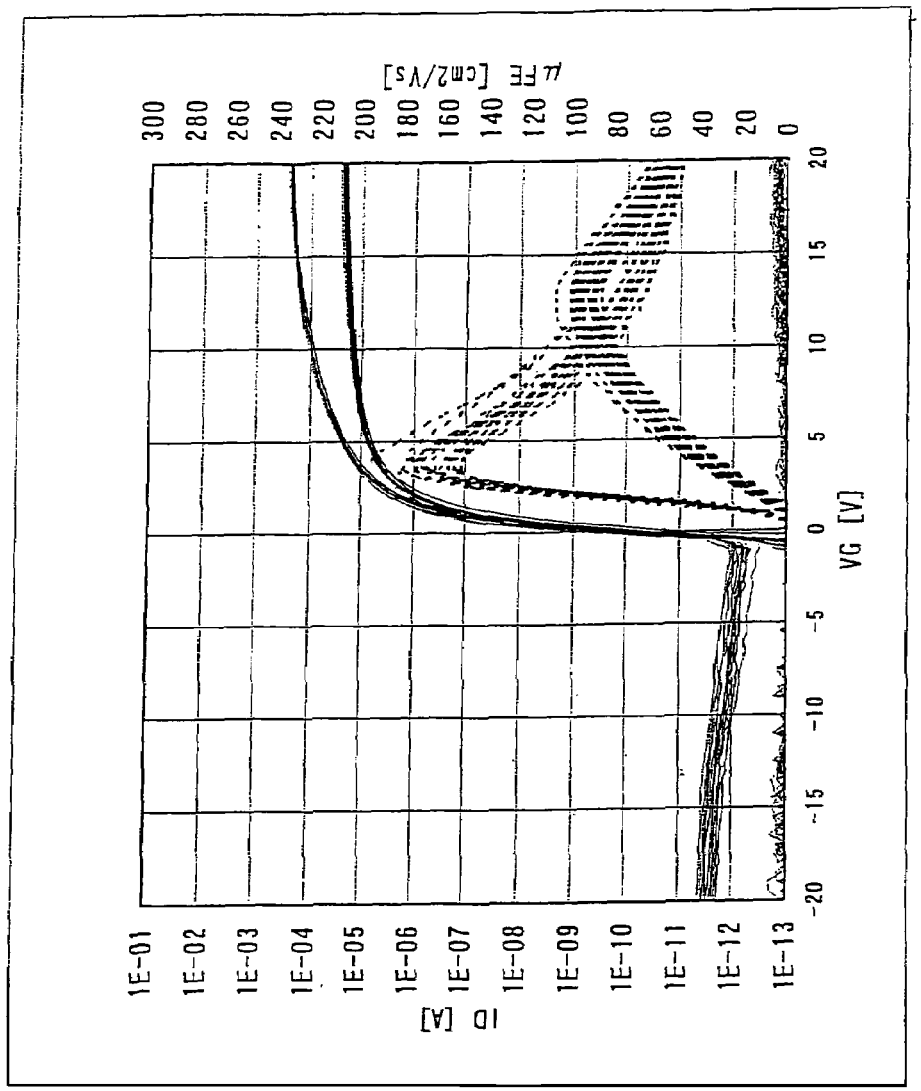

Fig. 1B

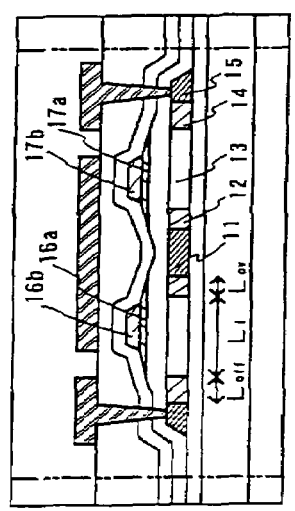

Fig. 1A

13: channel region
14: n-type impurity region containing a first concentration impurity element (n-type impurity concentration $1 \times 10^{15} - 1 \times 10^{17}/cm^3$)
12: n-type impurity region containing a second concentration impurity element (n-type impurity concentration $1 \times 10^{17} - 1 \times 10^{18}/cm^3$)
11, 15: n-type impurity region containing a third concentration impurity element (n-type impurity concentration $1 \times 10^{20} - 1 \times 10^{21}/cm^3$)
16: first gate electrode (electrode(A) 16a, electrode(B) 16b)
17: second gate electrode (electrode(A) 17a, electrode(B) 17b)

$L_1 : 3.3 \mu m$
$L_{off} : 2.0 \mu m$
$L_{ov} : 1.2 \mu m$

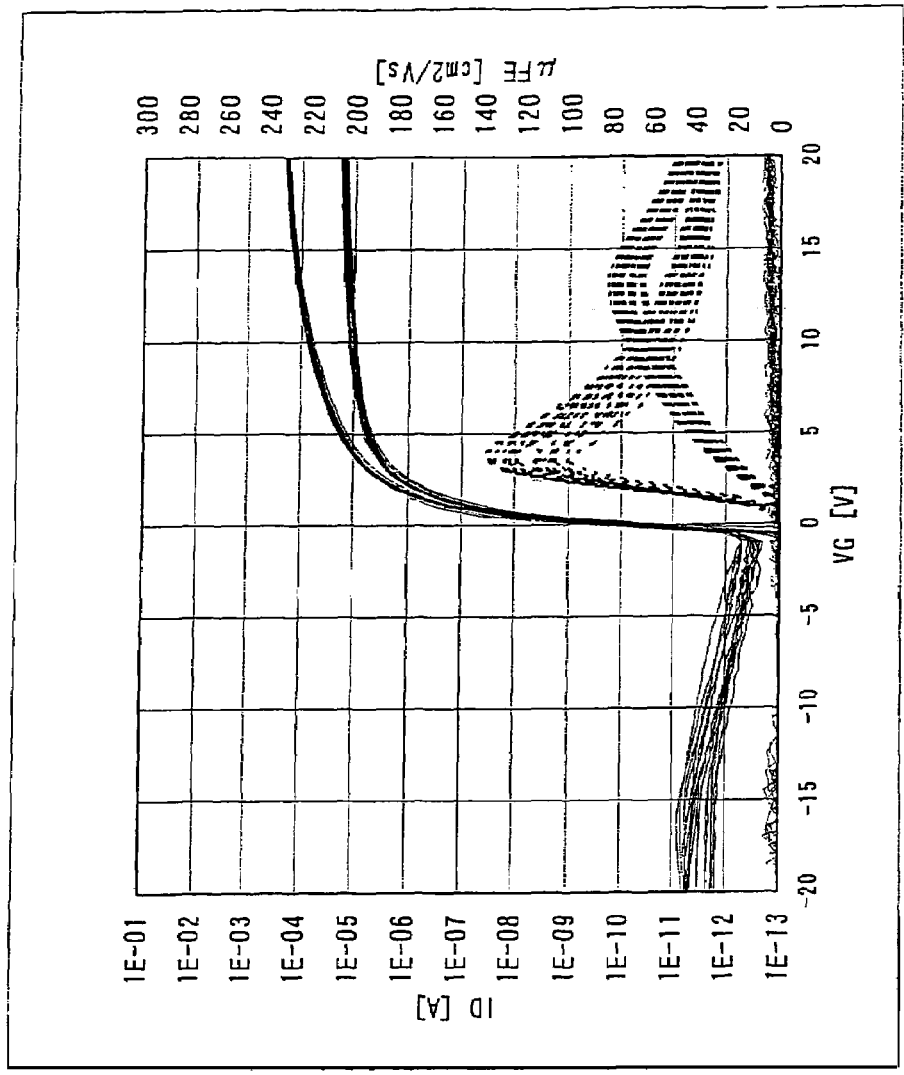

Fig. 2B

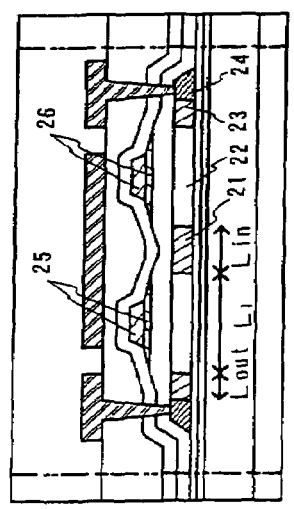

22: channel region
21, 23: n-type impurity region
   containing a second concentration impurity element
   (n-type impurity concentration $1\times10^{17} - 1\times10^{19}/cm^3$)
24: n-type impurity region
   containing a third concentration impurity element
   (n-type impurity concentration $1\times10^{20} - 1\times10^{21}/cm^3$)
25: first gate electrode
   (electrode(A) 25a, electrode(B) 25b)
26: second gate electrode
   (electrode(A) 26a, electrode(B) 26b)
L : 4.5 μm
Lout : 2.0 μm
Lin : 3.0 μm

Fig. 2A

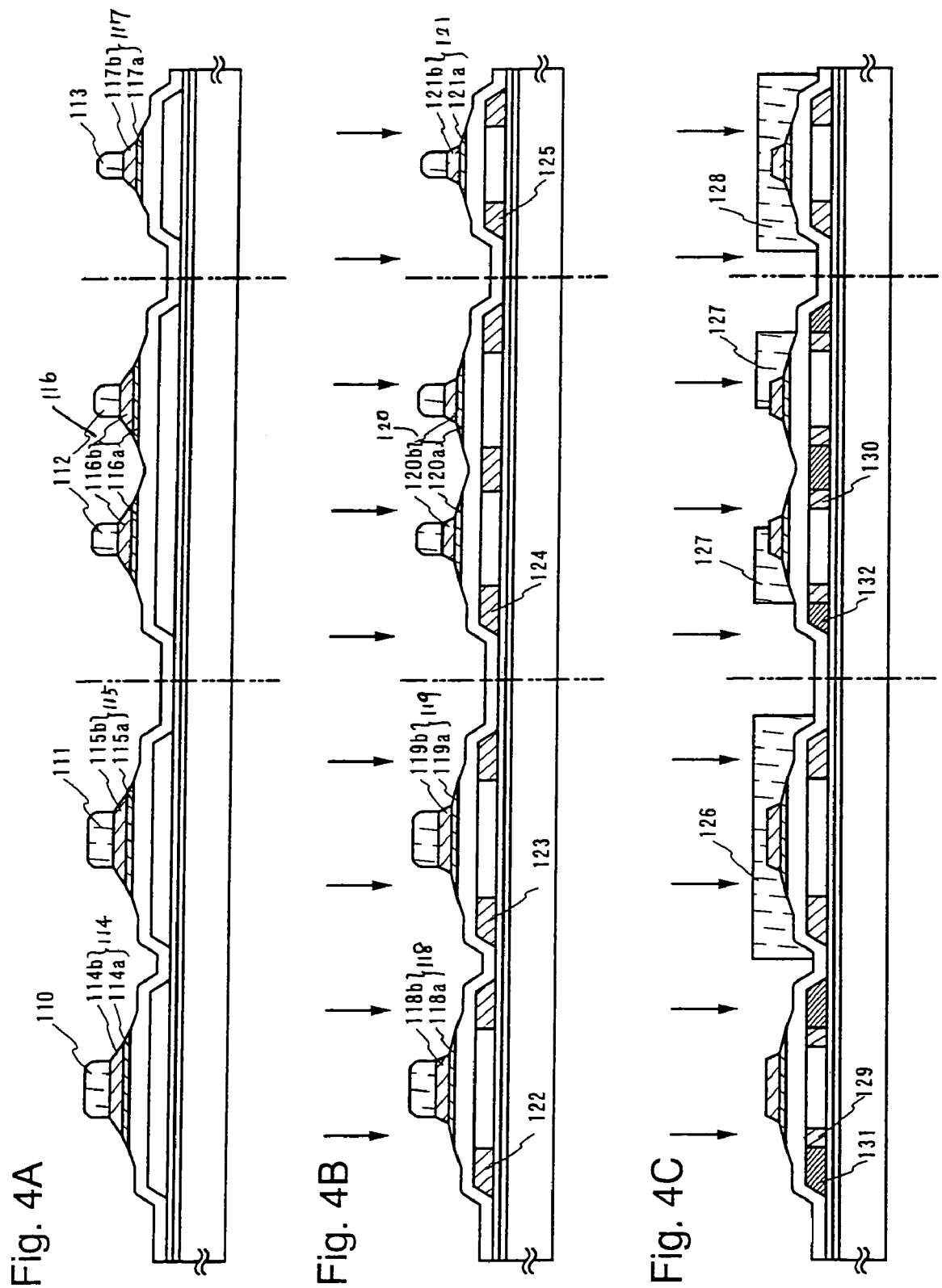

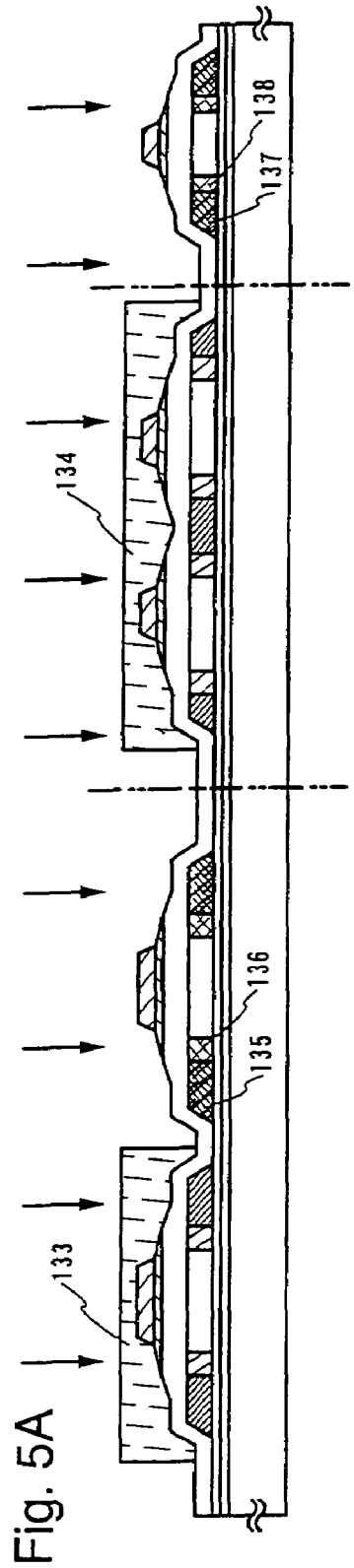
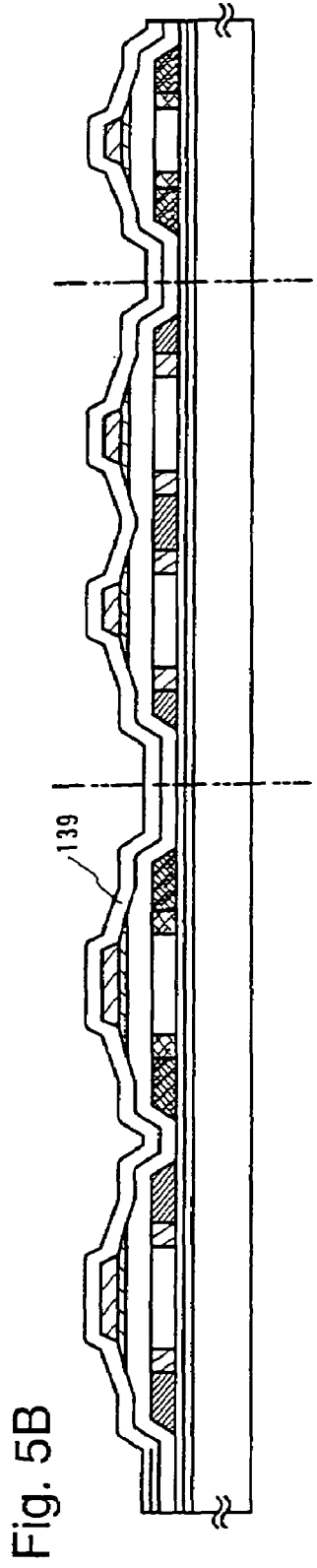
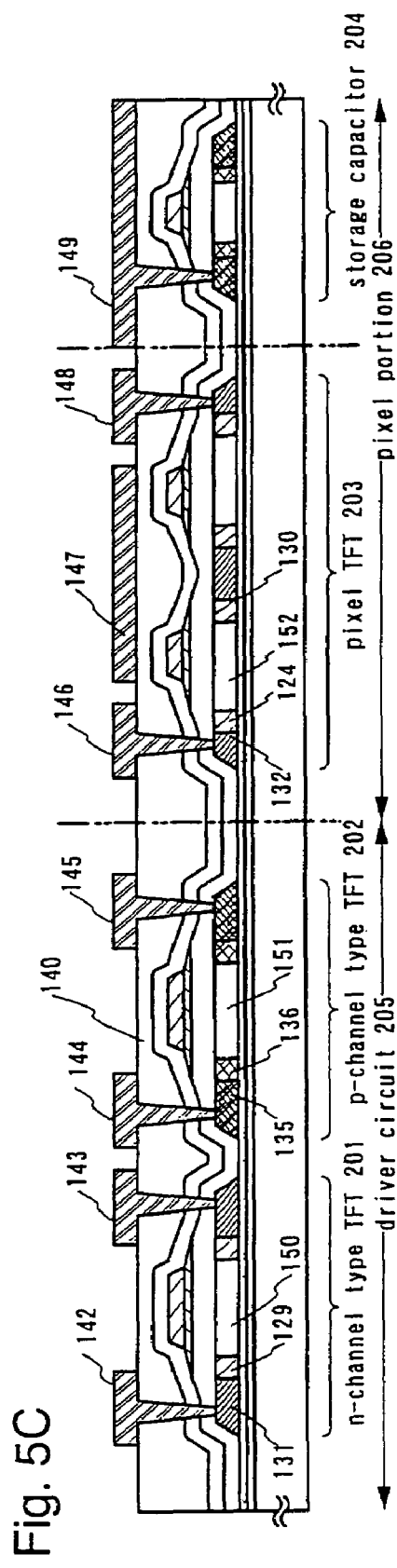

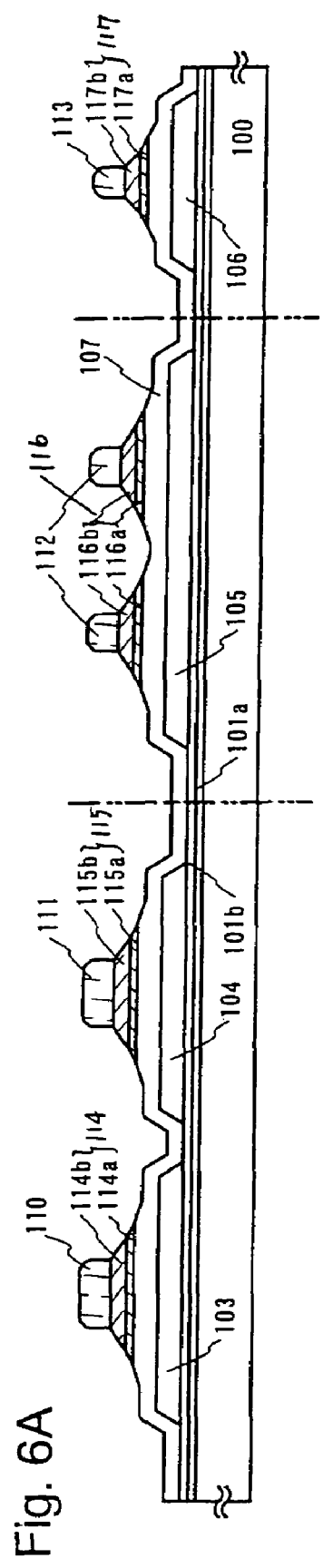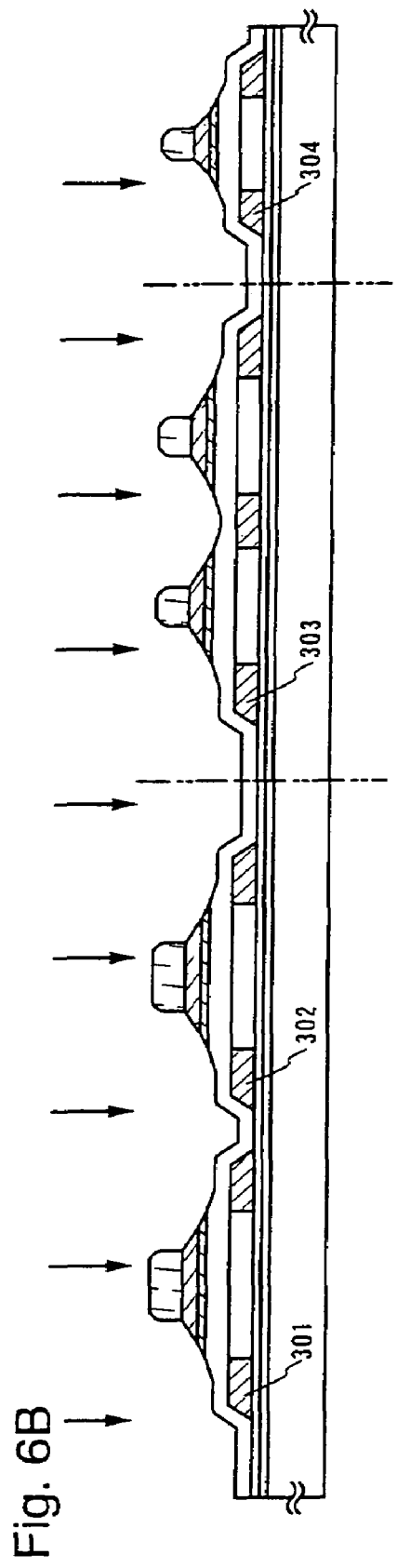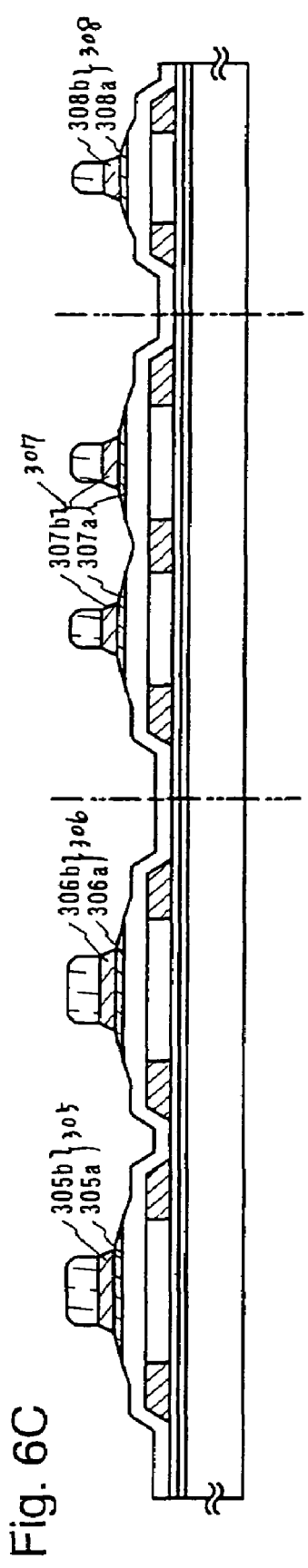

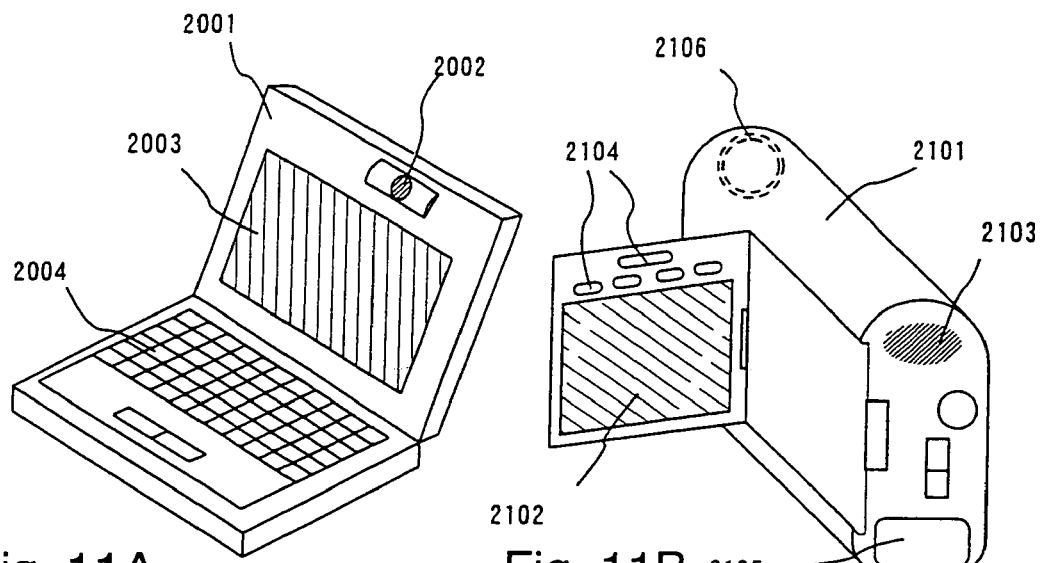
Fig. 11A
Fig. 11B
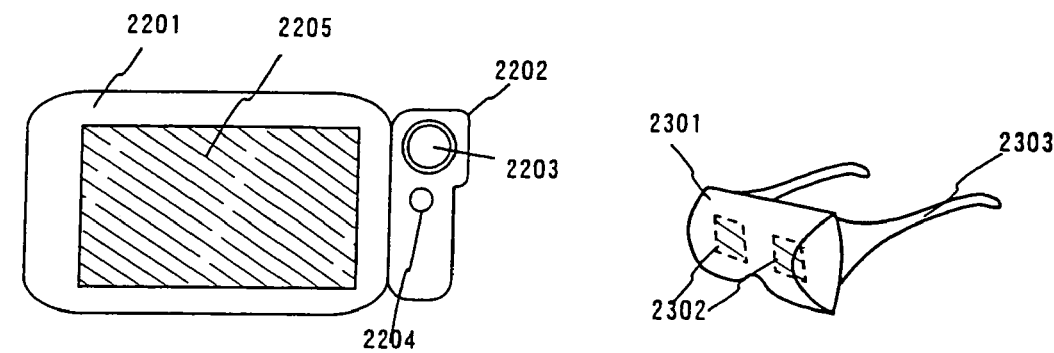
Fig. 11C
Fig. 11D
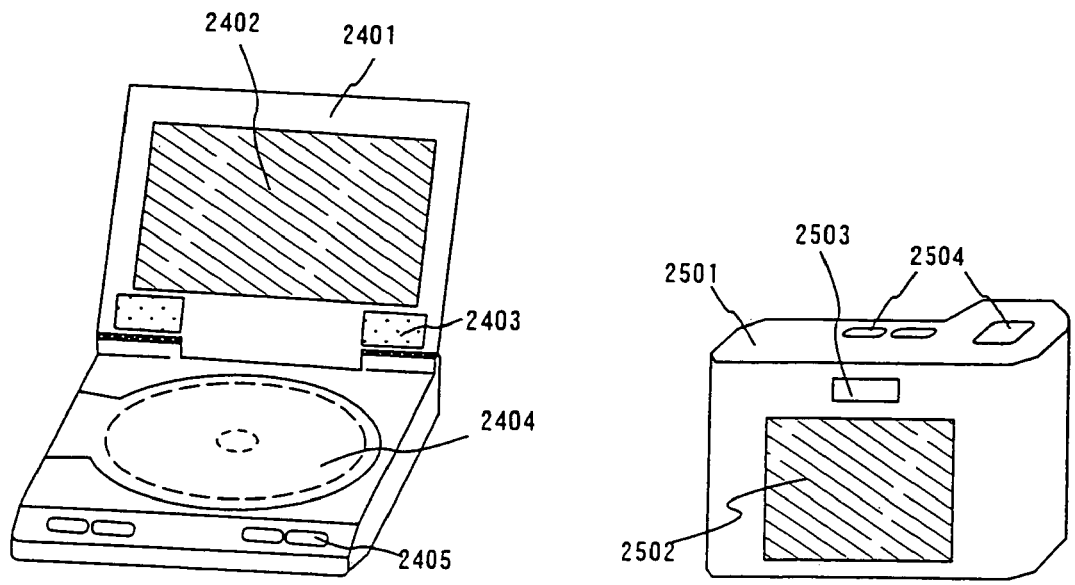
Fig. 11E
Fig. 11F

SEMICONDUCTOR DEVICE AND MANUFACTURING METHOD THEREOF

BACKGROUND OF THE INVENTION

1. Field of the Invention

The present invention relates to a semiconductor device using a semiconductor film having a crystalline structure, and to a method of manufacturing the semiconductor device. More specifically, the present invention relates to a semiconductor device having a thin film transistor (TFT) containing an active layer having a channel forming region, a source region, and a drain region from a semiconductor film having a crystalline structure, and a method of manufacturing the semiconductor device.

2. Description of the Related Art

Liquid crystal display devices have widened the marketplace with their advantages of low electric power consumption and space conservation, and have finally reached the point of substituting for CRTs as televisions used daily in households. As such, bright display at high definition equal to or better than that of CRTs, and a price comparable to that of CRTs, are sought for liquid crystal display devices.

Demanded of TFTs formed in pixel portions of liquid crystal display devices in general use as displays (display devices) is mainly a low off current (electric current flowing when the TFTs are in an off operation state). Even a slight leak of the off current in an off operation state of the TFT invites a reduction in contrast and in image quality. There has been a problem with TFTs containing active layers having a crystalline structure, which are recently used more and more due to their high field effect mobility, in that the off current becomes large.

An LDD (lightly doped drain) structure is known as a technique of suppressing the off current. In Japanese patent #3072655 (structure shown in FIG. 2A), a structure is disclosed in which a first transistor and a second transistor are connected in series, sandwiching a low concentration impurity region (double gate structure having a low concentration impurity region sandwiched by channel forming regions).

The demand for making liquid crystal display devices have higher definition is met by increasing the number of pixels, and the demand for higher brightness is met by increasing the aperture ratio. Screen size is determined by standards, and therefore it is necessary to increase the number of pixels within a limited pixel surface area. This means that the pixel size must be shrunk, and that a technique for further increasing the aperture ratio must be achieved while reducing the pixel size. There are limitations on making the wiring width narrower for increase of the aperture ratio, considering problems such as a rise of the wiring resistance. Thus, making the size of switching TFTs within the pixels smaller can be considered.

Further, the size of storage capacitors can be made smaller provided that the off current of the switching TFTs of the pixels can be made smaller. Therefore, it is very important to make TFTs having a low off current in order to additionally increase the aperture ratio.

However, the characteristics required by the circuits used on the same substrate are different. It is necessary to make TFTs having different structures depending upon which circuit they are used for. TFTs are manufactured by lamination while performing steps for etching semiconductor films, insulating films, and conductive films into predetermined shapes using photomasks. Therefore, if the TFT structure is optimized according to the requirements of the pixel portion or each driver circuit, then the number of photomasks simply increases, the manufacturing processes become complex, and the number of process steps inevitably increases. Further, TFTs having a sufficiently low off current cannot be manufactured even if small TFTs are manufactured in order to increase the aperture ratio in the pixel portion, and the reliability drops. It is not easy to manufacture the desired display device (semiconductor device).

SUMMARY OF THE INVENTION

With the aim of solving these problems, an object of the present invention is to provide a TFT having a low off current at a small pixel size (small TFT size), and to provide a technique for achieving optimal TFT structures for the driving conditions of a pixel portion and driver circuits by using a small number of photomasks.

Further, an object of the present invention is to provide a technique of making different TFTs, having a low off current and having TFT structures optimal for the driving conditions of a pixel portion and driver circuits, without increasing the number of manufacturing processes or the production costs.

A semiconductor device according to the present invention is characterized by comprising: a semiconductor layer; a gate insulating film formed on the semiconductor layer; and a gate electrode formed on the gate insulating film, in which: the semiconductor layer has a channel forming region, a region containing a first concentration impurity element, a region containing a second concentration impurity element, and a region containing a third concentration impurity element; the gate electrode is a laminate of an electrode (A) and an electrode (B); and one edge portion of the electrode (A) overlaps with the region containing the second concentration impurity element, through the gate insulating film, and another edge portion of the electrode (A) overlaps with the channel forming region, through the gate insulating film.

Further, a semiconductor device according to the present invention is characterized by comprising: a semiconductor layer; a gate insulating film formed on the semiconductor layer; a first gate electrode formed on the gate insulating film; and a second gate electrode formed on the gate insulating film, in which: the semiconductor layer has a channel forming region, a region containing a first concentration impurity element, a region containing a second concentration impurity element, and a region containing a third concentration impurity element; the first gate electrode and the second gate electrode are laminates of an electrode (A) and an electrode (B); one edge portion of the first electrode overlaps with the region containing the second concentration impurity element, through the gate insulating film, and another edge portion of the first electrode overlaps with the channel forming region, through the gate insulating film; and the region containing the third concentration impurity element exists between: the region containing the second concentration impurity element and overlapping with the electrode (A) of the first gate electrode; and the region containing the second concentration impurity element and overlapping with the electrode (A) of the second gate electrode.

Further, a semiconductor device according to the present invention is characterized by comprising: a semiconductor layer; a gate insulating film formed on the semiconductor layer; a first gate electrode formed on the gate insulating film; and a second gate electrode formed on the gate insulating film, in which: the semiconductor layer has a channel forming region, a region containing a first concentration impurity element, a region containing a second concentration impurity element, and a region containing a third concentration impurity element; the first gate electrode and the second gate electrode are laminates of an electrode (A) and an electrode (B); one edge portion of the electrode (A) overlaps with the region containing the second concentration impurity element, through the gate insulating film, and the other edge portion of the electrode (A) overlaps with the channel forming region, through the gate insulating film; the channel forming region is sandwiched between an n-type impurity region containing a first concentration of an n-type impurity element, and an n-type impurity region containing a second concentration of the n-type impurity element; an n-type impurity region containing a third concentration of the n-type impurity element exists adjacent to the n-type impurity region containing the first concentration of the n-type impurity element, and an n-type impurity region containing the third concentration of the n-type impurity element exists adjacent to the n-type impurity region containing the second concentration of the n-type impurity element; the region containing the third concentration impurity element exists between: the region containing the second concentration impurity element and overlapping with the electrode (A) of the first gate electrode; and the region containing the second concentration impurity element and overlapping with the electrode (A) of the second gate electrode; and the n-type impurity region containing the third concentration impurity element, adjacent to the n-type impurity region containing the first concentration impurity element, functions as a source region or a drain region.

Further, according to the present invention, the above-mentioned semiconductor device is characterized in that: the region containing the first concentration impurity element contains the n-type impurity element at a concentration of $1 \times 10^{15}$ to $1 \times 10^{17}/cm^3$; the region containing the second concentration impurity element contains the n-type impurity element at a concentration of $1 \times 10^{17}$ to $1 \times 10^{19}/cm^3$; and the region containing the third concentration impurity element contains the n-type impurity element at a concentration of $1 \times 10^{20}$ to $1 \times 10^{21}/cm^3$.

Further, according to the present invention, the above-mentioned semiconductor device is characterized in that: the electrode (A) is: a conductive film made from an element selected from the group consisting of W, Mo, Ta, and Ti; a conductive film made from a chemical compound having one of the elements as its main constituent; or a conductive film made from an alloy having one of the elements as its main constituent.

The semiconductor device disclosed by the present invention has a region which contains a second concentration impurity element and which overlaps with a gate electrode through a gate insulating film, and an impurity region which contains a first concentration impurity element and which does not overlap with the gate electrode. The region containing the second concentration impurity element has an impurity region (Loff region) which contains the first concentration impurity element and which does not overlap with the gate electrode. By possessing this Loff region, the width of the energy barrier of PN junctions formed within the semiconductor layer becomes broader, the electric field strength added to the PN junction portions becomes weaker, and the off current can be reduced. Further, by having the impurity region (Lov region) which contains the second concentration of the impurity and which overlaps with the gate electrode through the gate insulating film, this becomes a structure in which on current degradation is prevented. A semiconductor device having high reliability can therefore be obtained.

A method of manufacturing the aforementioned semiconductor device (TFT) is characterized by comprising the steps of:

forming a first semiconductor layer, a second semiconductor layer, a third semiconductor layer, and a fourth semiconductor layer on an insulating surface;

forming a gate insulating film on the first through the fourth semiconductor layers;

forming a first conductive film and a second conductive film on the gate insulating film;

etching the first conductive film and the second conductive film, forming a first shape gate electrode, composed of a first electrode and a second electrode, on the first through the fourth semiconductor layers;

etching the first electrode and the second electrode, forming a second shape gate electrode, composed of a third electrode and a fourth electrode;

adding an n-type impurity element to the first through the fourth semiconductor layers in a self aligning manner, with the second shape gate electrode as a mask, forming an n-type impurity region containing a first concentration of the n-type impurity element;

forming a first mask covering all of the second semiconductor layer and all of the fourth semiconductor layer, and forming a second mask covering a portion of the third semiconductor layer;

forming a second concentration impurity region, and an n-type impurity region containing a third concentration of the n-type impurity element, in the first semiconductor layer, through the third electrode, with the fourth electrode on the first semiconductor layer as a mask; and forming an n-type impurity region containing a second concentration of the n-type impurity element, and an n-type impurity region containing the third concentration of the n-type impurity element, in the third semiconductor layer, through the third electrode, with the fourth electrode and the second mask as masks.

TFTs meeting the demands of different circuits can thus be formed separately on the same substrate without increasing the number of manufacturing process steps and without increasing production costs. Thus, a semiconductor device having a low off current and high reliability can be manufactured.

BRIEF DESCRIPTION OF THE DRAWINGS

In the accompanying drawings:

FIGS. 1A and 1B are diagrams showing a semiconductor device of the present invention, and the electrical characteristics of the semiconductor device, respectively;

FIGS. 2A and 2B are diagrams showing the structure of an example of a conventional semiconductor device, and the electrical characteristics of the conventional semiconductor device, respectively;

FIGS. 4A to 4C are diagrams showing the manufacturing process of a semiconductor device of the present invention;

FIGS. 5A to 5C are diagrams showing the manufacturing process of a semiconductor device of the present invention;

FIGS. 6A to 6C are diagrams showing an example of an embodiment of the present invention;

FIGS. 11A to 11F are diagrams showing examples of electric equipment;

DETAILED DESCRIPTION OF THE PREFERRED EMBODIMENTS

Embodiment Mode 1

Figure 3A:
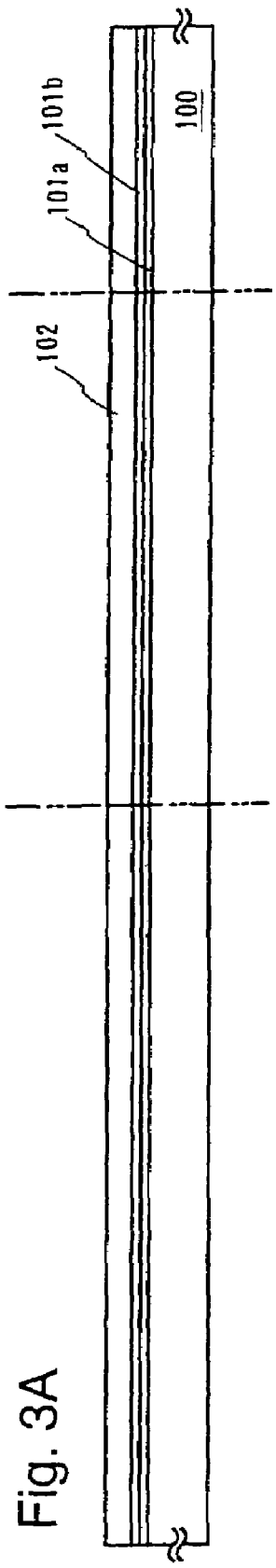
FIGS. 3A to 3C are diagrams showing a manufacturing process of a semiconductor device of the present invention.
Figure 3B:
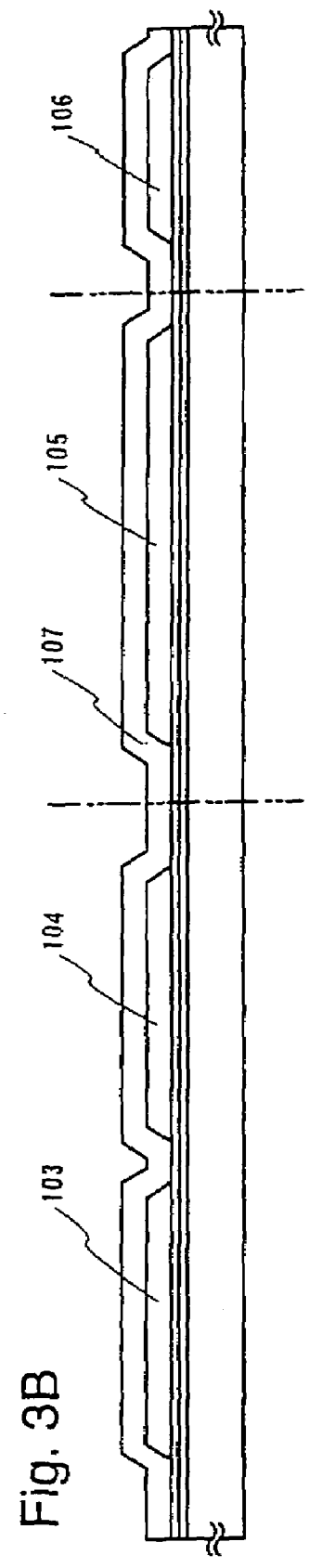

The structure of a TFT of the present invention is shown in FIG. 1A, and the results of measuring the electrical characteristics of the TFT of the present invention are shown in FIG. 1B.

The TFT has a semiconductor layer on an insulating surface, a gate insulating film on the semiconductor layer, and a gate electrode on the gate insulating film. The semiconductor layer contains a channel forming region 13, an n-type impurity region 14 containing a first concentration impurity element which imparts n-type conductivity (hereafter referred to as n-type impurity element), an n-type impurity region 12 containing a second concentration of the n-type impurity element, and n-type impurity regions 11 and 15 containing a third concentration of the n-type impurity element. The gate electrode has a first gate electrode 16 and a second gate electrode 17. The first gate electrode and the second gate electrode are composed of electrodes (A) 16a and 17a, and electrodes (B) 16b and 17b, respectively. One edge portions of the electrodes (A) 16a and 17a overlap with the n-type impurity region 12 containing the second concentration of the n-type impurity element, through the gate insulating film. Another edge portions of the electrodes (A) 16a and 17a overlap with the channel forming region, through the gate insulating film.

Further, the n-type impurity region 11 containing the third concentration of the n-type impurity element is disposed between: the n-type impurity region 12 which contains the second concentration of the n-type impurity element and which overlaps with the electrode (A) 16a of the first gate electrode; and the n-type impurity region which contains the second concentration of the n-type impurity element and which overlaps with the electrode (A) 17a of the second gate electrode.

Note that the n-type impurity region 14 containing the first concentration of the n-type impurity element has a concentration of $1 \times 10^{15}$ to $1 \times 10^{17}/cm^3$ of the n-type impurity element. Further, the n-type impurity region 12 containing the second concentration of the n-type impurity element has a concentration of $1 \times 10^{17}$ to $1 \times 10^{19}/cm^3$ of the n-type impurity element. The n-type impurity regions 11 and 15, containing the third concentration of the n-type impurity element, have concentrations of $1 \times 10^{20}$ to $1 \times 10^{21}/cm^3$ of the n-type impurity element.

Further, in this specification, the n-type impurity region containing the first concentration of the n-type impurity element is an LDD (lightly doped drain) region containing the n-type impurity element at a low concentration, and this region is referred to as an Loff region (where "off" indicates "offset") because it is a region that does not overlap with the gate electrode. The n-type impurity region 12 containing the second concentration of the n-type impurity element is referred to as an Lov region (where "ov" indicates "overlap") because it overlaps with the electrode (A) through the gate insulating film.

Note that the applicants of the present invention manufactured TFTs which, as disclosed by Japanese Patent #3072655, have a double gate structure (a first gate electrode 25 and a second gate electrode 26) in which: a first channel forming region and a second channel forming region, n-type impurity regions 21 and 23 containing the second concentration of the n-type impurity element, and an n-type impurity region 24 containing the third concentration of the n-type impurity element are contained in a semiconductor layer; and in addition, an n-type impurity region (internal L) 21 containing the second concentration of the n-type impurity element is formed between the first channel forming region and the second channel forming region. A schematic diagram of the TFT structure is shown in FIG. 2A, and the results of measuring the electrical characteristics of the TFTs are shown in FIG. 2B.

Comparing the behavior in the off region of the TFT of the present invention with that of the TFT disclosed by the above patent, it can be seen that both display almost the same type of behavior (the off current increases by a little in accordance with a shift of a gate voltage in the negative direction). However, when investigating the on current at the time of VG=10 V and 20 V, for example, the TFT of the present invention was found to have an on current of $1 \times 10^{-4}$ A and $6 \times 10^{-3}$ A, respectively. The TFT structure disclosed by the above patent was found to have an on current of $3 \times 10^{-4}$ A and $8 \times 10^{-3}$ A at the time of VG=10 V and 20 V, respectively. Comparing the behavior in the on region, it can be seen that a higher on current can be obtained in the TFT of the present invention.

Unless the conventional technique TFT of FIGS. 2A and 2B is 3 µm larger than the size of the semiconductor layer of the TFT disclosed by the present invention, the TFT having similar behavior in the off region cannot be obtained. Further, the on current is a parameter for easily evaluating reliability, and the on current obtained by the TFT disclosed by the present invention is larger than the on current obtained with the TFT structure disclosed by the aforementioned patent. This is thought to be because the Loff region and the Lov region are formed in the TFT disclosed by the present invention. TFTs having a small off current can thus be obtained even if the size of the semiconductor layer is small.

According to the present invention, both the problem of having to make the pixel size smaller due to an increased number of pixels for high image quality, and the problem of having to achieve a high aperture ratio for higher brightness, can thus be resolved at the same time.

Embodiment Mode 2

The electrical characteristics of TFTs manufactured by setting the size between a plurality of gate electrodes (two gate electrodes in Embodiment Mode 2) equal to 2 µm, for multi-gate TFTs having the TFT structure disclosed by the present invention (refer to FIG. 1A) and for those having the TFT structure already disclosed by a conventional technique (refer to FIG. 2A), are compared in Embodiment Mode 2.

Measurements were performed with the gate voltage VG varied from −20 to 20 V, and the source voltage VS=0 V. The results of measuring the current (on current) at the following two points: (1) the drain voltage VD=1 V and VG=10 V; and (2) the drain voltage VD=14 V and VG=10 V, and the results of measuring the current (off current) at the following two points: (3) VD=1 V and VG=−17.5 V; and (4) VD=14 V and VG=−4.5 V, are shown in FIGS. 14A to 14D, respectively.

The on current at the measurement points (1) and (2) is higher with the structure of the present invention compared to the conventional structure. This is thought to be because a region exists in which the low concentration impurity region (LDD region) overlaps with the gate electrode, through the gate insulating film, and therefore the on current is higher.

The off current at the measurement points (3) and (4) is lower with the structure of the present invention compared to the conventional structure. Therefore the surface area occupied by a storage capacitor can be made smaller by the amount that the leak current becomes lower, provided that the very low off current TFT is used as a pixel switching element. Thus, the aperture ratio in a pixel portion can be increased.

It is thus understood that better electrical characteristics (on current and off current) can be obtained with TFTs having the structure disclosed by the present invention when the electrical characteristics of two TFTs having different structures and the same size are compared to each other.

EMBODIMENTS

Embodiment 1

One embodiment of the present invention is explained below using FIGS. 3A to 5C. A method of manufacturing a pixel portion and driver circuit TFTs (n-channel TFTs and a p-channel TFT), formed in the periphery of the pixel portion, at the same time on the same substrate is explained here in detail.

In FIG. 3A, aluminum borosilicate glass is used for a substrate 100. A first insulating film is formed on the substrate 100. A 50 nm thick first silicon oxynitride film 101a formed using $SiH_4$, $NH_3$, and $N_2O$ as reactant gasses, and a 100 nm thick second silicon oxynitride film 101b formed using $SiH_4$ and $N_2O$ as reactant gasses, are laminated in Embodiment 1.

Semiconductor layers 103 to 106 (for convenience in Embodiment 1, a first semiconductor layer 103, a second semiconductor layer 104, a third semiconductor layer 105, and a fourth semiconductor layer 106) are formed of a semiconductor film 102 having a crystalline structure. The crystalline semiconductor film 102 is formed by using a known crystallization method after forming an amorphous semiconductor film on the first insulating film. In Embodiment 1, a 50 nm thick amorphous silicon film is formed, light from an excimer laser is condensed into a linear shape by an optical system, and this light is irradiated onto the amorphous silicon film, performing crystallization. The power density of the laser light is set to 300 mJ/cm$^2$, and the linear shape laser light having a thickness of 500 µm is irradiated over the entire surface of the amorphous silicon film while overlapping at a 90 to 98% ratio.

After crystallization, boron is added to the semiconductor film by ion doping as an acceptor impurity in order to control the TFT threshold value voltage. The concentration of the added boron may be suitably determined by an operator.

The polycrystalline silicon film thus formed is then divided into island shapes by an etching process, forming the semiconductor films 103 to 106. A 110 nm thick silicon oxynitride film is then formed thereon by plasma CVD, using $SiH_4$ and $N_2O$ as reactant gasses, as a gate insulating film 107 (see FIG. 3B).

Figure 3C:
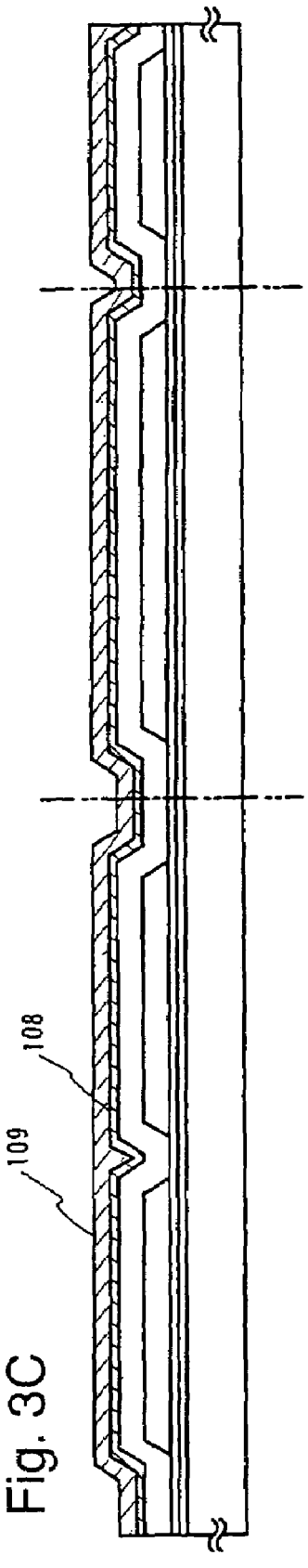

In addition, a tantalum nitride film as a first conductive film 108 is formed on the gate insulating film 107 by sputtering to have a thickness of 30 nm, and tungsten is deposited with a thickness of 300 nm as a second conductive film 109 (see FIG. 3C).

Masks 110 to 113 are formed next using a photosensitive resist material, as shown in FIG. 4A. A first etching process is then performed on the first conductive film 108 and the second conductive film 109. An ICP (inductively coupled plasma) etching method is used for etching. There is no limitation on an etching gas, but a gas mixture of $CF_4$, $Cl_2$, and $O_2$ is used as an etching gas for etching of the W film or the tantalum nitride film. The gas flow rates are set to 25/25/10 sccm, respectively. A 500 W RF (13.56 MHz) electric power is applied to a coil shape electrode at a pressure of 1 Pa, and etching is performed. A 150 W RF (13.56 MHz) electric power is also applied to the substrate side (test piece stage), effectively applying a negative self-bias voltage. The W film is mainly etched into a predetermined shape under the above first etching conditions.

Next, the etching gasses are changed to $CF_4$ and $Cl_2$, the gas flow rate ratio is set to 30/30, an RF (13.56 MHz) electric power of 500 W is applied to the coil shape electrode at a pressure of 1 Pa, generating a plasma, and etching is performed for on the order of 30 seconds. An RF (13.56 MHz) electric power of 20 W is also applied to the substrate side (test piece stage), effectively applying a negative self-bias voltage. The mixed gas of $CF_4$ and $Cl_2$ etches the tantalum nitride film and the W film at similar speeds. First shape gate electrodes 114 to 117 composed of first electrodes 114a to 117a and second gate electrodes 114b to 117b, respectively, having tapered edge portions are thus formed. The taper is formed from 45 to 75°. Note that the etching time may be increased on the order of 10 to 20% in order to perform etching without any residue on the second insulating film. Note also that the surfaces of regions of the gate insulating film 107 which are not covered by the first shape gate electrodes 114 to 117 are etched on the order of 20 to 50 nm, forming regions which have become thinner.

A second etching process is performed next as shown in FIG. 4B without removing the masks 110 to 113. $CF_4$, $Cl_2$, and $O_2$ are used as etching gasses, and the gas flow rates are set so as to be 20/20/20, respectively. Etching is performed at a pressure of 1 Pa with an RF (13.56 MHz) electric power of 500 W applied to a coil shape electrode. An RF (13.56 MHz) electric power of 20 W is also applied to the substrate side (test piece stage), effectively applying a lower self bias voltage compared to that of the first etching process. The W film used as the second conductive film is etched using these etching conditions. Second shape gate electrodes 118 to 121 composed of third electrodes 118a to 121a and fourth electrodes 118b to 121b, respectively, are thus formed. The surfaces of regions of the gate insulating film 107 which are not covered by the second shape gate electrodes 118 to 121 are etched on the order of 20 to 50 nm, becoming thinner. Note that, for convenience, the third electrodes and the fourth electrodes are also referred to as electrodes (A) and electrodes (B), respectively, in this specification.

A first doping process for adding an impurity element which imparts n-type conductivity (an n-type impurity element) to the semiconductor layers is then performed. The first doping process is performed by ion doping in which ions are injected without separation of mass. Doping is performed using the first shape of gate electrodes 114 to 117 as masks, and n-type impurity regions 122 to 125 containing a first concentration of the n-type impurity element are formed in the semiconductor films 103 to 106 using phosphine (PH$_3$) gas diluted by hydrogen, or phosphine gas diluted by a noble gas. The phosphorous concentration of the n-type impurity regions 122 to 125 containing the first concentration of the n-type impurity element thus formed by doping is set so as to become from $1 \times 10^{16}$ to $1 \times 10^{17}/cm^3$.

Next, first masks 126 and 128 are then formed covering all of the second semiconductor layer 104 and all of the fourth semiconductor layer 106, and a second mask 127 is formed covering a portion of the third semiconductor layer 105 and a portion of the second shape gate electrode 120 on the third semiconductor layer 105. A second doping process is then performed. N-type impurity regions 129 and 130 containing a second concentration of the n-type impurity element are formed in the first semiconductor layer 103 and in the third semiconductor layer 105, through the third electrodes (electrodes (A)) 118a and 120a, by the second doping process. The phosphorous concentration of the n-type impurity regions containing the second concentration of the n-type impurity element thus formed by doping is set so as to become from $1 \times 10^{17}$ to $1 \times 10^{19}/cm^3$.

A third doping process is performed next with the masks 126 to 128 left as is. An n-type impurity element is added to the first semiconductor layer 103 and to the third semiconductor layer 105, through the gate insulating film 107, forming n-type impurity regions 131 and 132 containing a third concentration of the n-type impurity element. The phosphorous concentration of the n-type impurity regions containing the third concentration of the n-type impurity element thus formed by doping is set so as to become from $1 \times 10^{20}$ to $1 \times 10^{21}/cm^3$.

Note that although the impurity element is added twice in Embodiment 1 as discussed above, the n-type impurity regions containing the second concentration of the n-type impurity element and the n-type impurity regions containing the third concentration of the n-type impurity element can also be formed in one doping step by controlling the film thickness of the gate insulating film and the film thickness of the third electrode forming the gate electrode, and by regulating the acceleration voltage used in doping.

Masks 133 and 134 are formed next as shown by FIG. 5A, covering the first semiconductor layer 103 and the third semiconductor layer 105, and a fourth doping process is performed. Doping is performed using diborane (B$_2$H$_6$) gas diluted by hydrogen, or using diborane gas diluted by a noble gas. A p-type impurity region 136 containing a first concentration of the p-type impurity element, and a p-type impurity region 135 containing a second concentration of the p-type impurity element are formed in the second semiconductor layer 104. Further, in the fourth semiconductor layer 107 that forms a storage capacitor in the pixel portion, a p-type impurity region 138 containing the first concentration of the p-type impurity element, and a p-type impurity region 137 containing the second concentration of the p-type impurity element are formed. The p-type impurity regions 136 and 138 containing the first concentration of the p-type impurity element are formed in regions overlapping with the electrodes (A) 119a and 121a, and contain boron in a concentration range from $1 \times 10^{18}$ to $1 \times 10^{20}/cm^3$. The p-type impurity regions 135 and 137 containing the second concentration of the p-type impurity element contain boron in a concentration range from $2 \times 10^{20}$ to $3 \times 10^{21}/cm^3$.

Regions in which phosphorous or boron is added to the respective semiconductor films are thus formed by the processes up through this point. The second shape gate electrodes 118 to 120 become gate electrodes. Further, the second shape electrode 121 becomes one capacitor electrode forming a storage capacitor in the pixel portion.

Next, as shown in FIG. 5B, light from the second harmonic (532 nm) of a YAG laser is irradiated to the semiconductor films in order to perform activation of the impurity elements added to the semiconductor films.

Note that, in addition to the method of irradiating light from the second harmonic of a YAG laser disclosed in Embodiment 1, a method of performing heat treatment at 550° C. for 4 hours using a furnace, or a heat treatment method performed by RTA (including RTA methods using gas or light as a heat source) may also be performed as the method of activating the impurity elements added to the semiconductor layers. If heat treatment using a furnace is performed, then an insulating film covering the gate electrodes and the gate insulating film may be formed prior to heat treatment in order to prevent oxidation of the conductive films forming the gate electrodes, and a reduced pressure nitrogen atmosphere may be used for the atmosphere in performing heat treatment. There are many methods of activating the impurity elements added to the semiconductor layers, and the actual method used may be suitably determined by the operator.

A first interlayer insulating film 139 made of a silicon nitride film or a silicon oxynitride film is then formed with a thickness of 50 nm by plasma CVD, as shown in FIG. 5B, and heat treatment is performed at 410° C. using a clean oven. Hydrogenation of the semiconductor film is performed by hydrogen emitted from the silicon nitride film or from the silicon oxynitride film.

A second interlayer insulating film 140 is then formed from acrylic on the first interlayer insulating film 139, and contact holes are formed. A part of the first interlayer insulating film and the third interlayer insulating film to form an external input-output terminal portion therein are also removed in this etching process. Wirings 142 to 149 are then formed by laminating a titanium film and an aluminum film.

A driver circuit 205 having an n-channel TFT 201 and a p-channel TFT 202, and a pixel portion 206 having a pixel TFT 203 and a storage capacitor 204 are thus formed on the same substrate. The storage capacitor 204 is constituted of the semiconductor layer 106, the gate insulating film 107, and the capacitor wiring 121.

Figure 16:
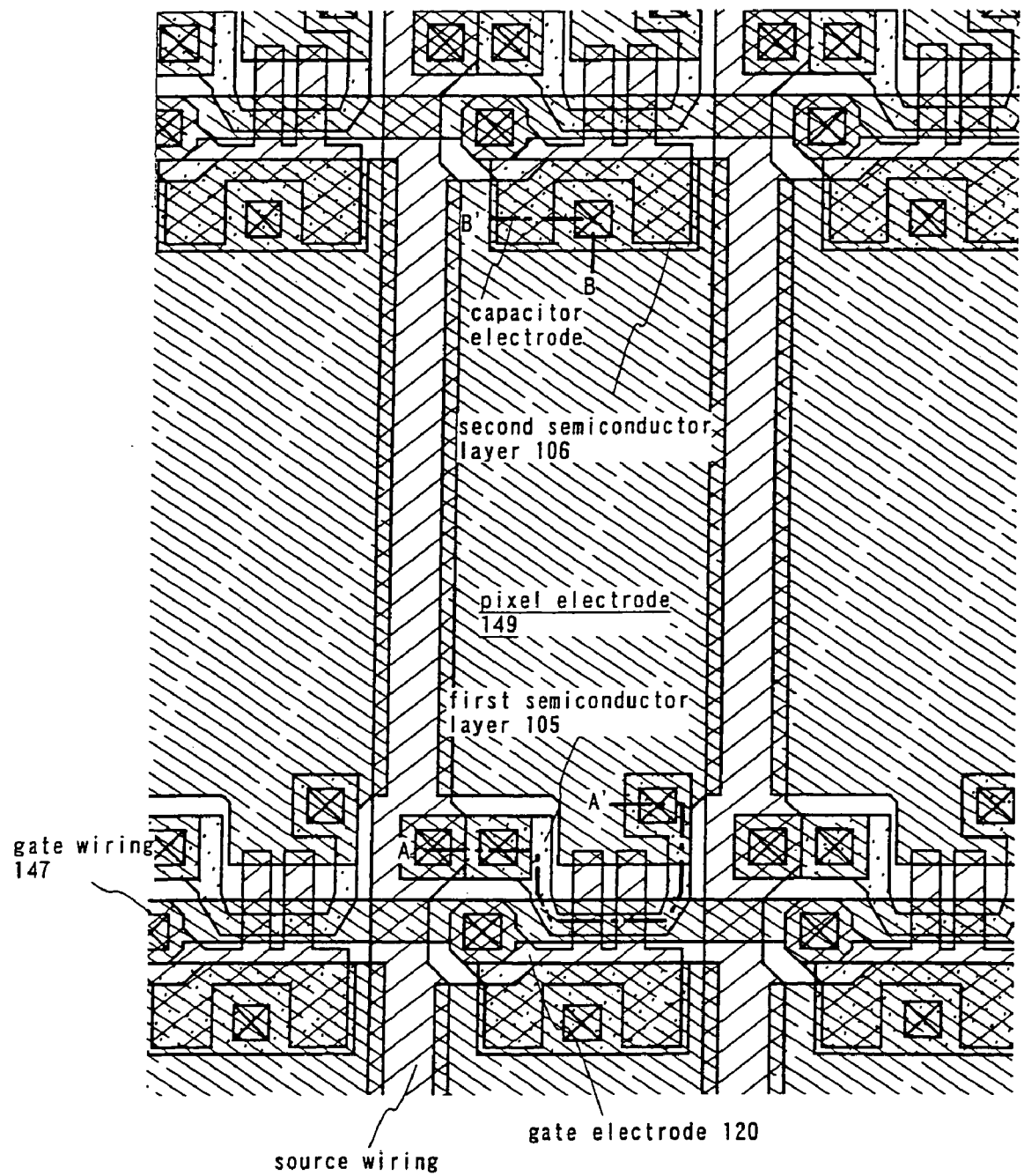
FIG. 16 is an upper surface diagram of a semiconductor device of the present invention.

An upper surface diagram of the pixel portion formed by the process steps up through this point is shown in FIG. 16. An upper surface diagram of nearly one pixel portion is shown in FIG. 16, and the attached reference numerals are common with those of FIGS. 5A to 5C. Further, cross sectional structures cut along line segments A-A' and B-B' of FIG. 16 correspond to FIGS. 5A to 5C. The TFT size in the pixel structure of FIG. 16 can be made smaller by applying the present invention, and therefore the aperture ratio of the pixel portion can be increased. Further, it becomes possible to superpose the gate wirings and the semiconductor layers by forming the gate wirings and the gate electrodes on different layers, and the gate wirings have an added function as light shielding films. This becomes a structure in which the formation of a light shielding film (black matrix) can be omitted if the edge portions of the pixel electrodes are disposed so as to overlap with the source wirings such that the gaps between the pixel electrodes are shielded from light.

The n-channel TFT 201 of the driver circuit 205 has: a channel forming region 150; an n-type impurity region 129 (Lov region) which contains the second concentration of the n-type impurity element and which overlaps with the electrode (A) 118a forming the gate electrode; and an n-type impurity region 131 which contains the third concentration of the n-type impurity element and which functions as a source region or a drain region. The length of the Lov region in the channel longitudinal direction is set from 0.5 to 2.5 μm, preferably 1.5 μm. The structure of this type of Lov region is chosen with the goal of preventing TFT deterioration mainly due to the hot carrier effect. Circuits such as shift register circuits, buffer circuits, level shifter circuits, and latch circuits can be formed by the n-channel TFT and the p-channel TFT. In particular, the n-channel TFT 201 structure is suitable for buffer circuits having a high driver voltage because of its goal of preventing deterioration due to the hot carrier effect.

The p-channel TFT 202 of the driver circuit 205 has: a channel forming region 151; a p-type impurity region 135 (region functioning as a source region or a drain region) which contains the first concentration p-type impurity element and which is formed on the outside of the electrode (A) 119a forming the gate electrode; and a p-type impurity region 136 containing the second concentration p-type impurity element and overlapping with the electrode (A) 119a.

The TFT (pixel TFT) 203 of the pixel portion 206 has: a channel forming region 152; an n-type impurity region 124 which contains the first concentration of the n-type impurity element and which is formed on the outside of the channel forming region 152; an n-type impurity region 130 containing the second concentration of the n-type impurity element and overlapping with the electrode (A) 120a forming the gate electrode through the gate insulating film; and an n-type impurity region 132 containing the third concentration of the n-type impurity element and functioning as a source region or a drain region. Furthermore, p-type impurity regions 137 and 138 are formed in the semiconductor layer 106 which functions as one electrode of the storage capacitor 204.

The present invention can thus determine suitable locations corresponding to the circuits having different operating conditions in the driver circuit portion and in the pixel portion.

Figure 10:
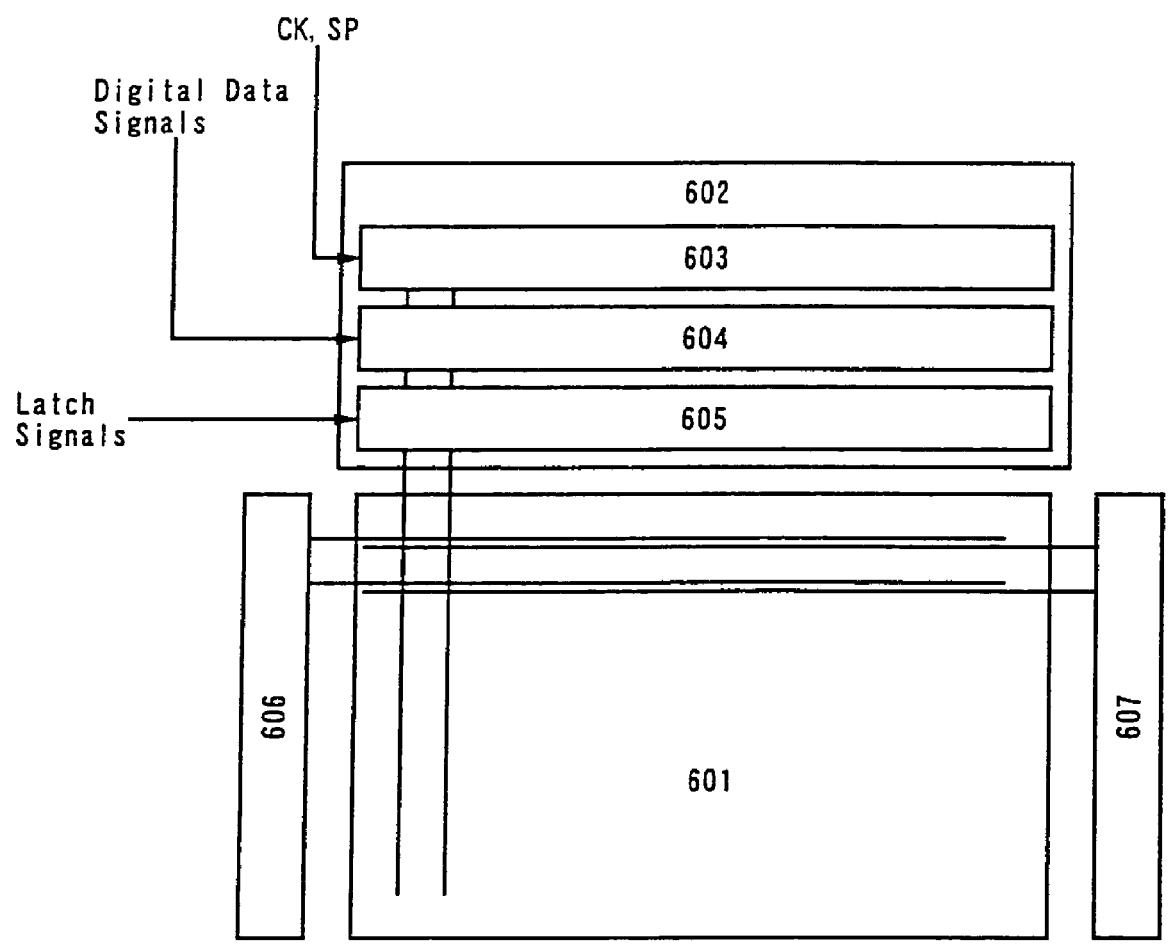
FIG. 10 is a diagram showing an example of an embodiment of the present invention.

FIG. 10 is a circuit block diagram showing an example of the circuit structure of an active matrix substrate. A pixel portion 601 formed from built-in TFTs, a date signal line driver circuit 602, and a scanning signal line driver circuit 606 are formed.

The data signal line driver circuit 602 is structured from a shift register 603, latches 604 and 605, and in addition, buffer circuits and the like. Clock signals and start signals are input to the shift register 603, and digital data signals and latch signals are input to the latches. Further, the scanning signal line driver circuit 606 also is structured from shift registers, buffer circuits, and the like. There may be an arbitrary number of pixels in the pixel portion 601, and 1024×768 pixels are formed for XGA.

A display device having active matrix drive can be formed by using the active matrix substrate. The pixel electrodes are formed by a material having light reflecting properties in Embodiment 1, and therefore a reflection type display device can be formed if this substrate is applied to a liquid crystal display device. A liquid crystal display device or a light emitting device in which the pixel portion is constituted of organic light emitting elements can be formed from this type of substrate. An active matrix substrate corresponding to a reflection type display device can therefore be manufactured.

Embodiment 2

Another embodiment of a method of manufacturing a semiconductor device is explained in Embodiment 2 using FIGS. 6A to 6C. Note that processes identical to those of Embodiment 1 are used up through the first etching process shown in FIG. 4A. The state of a substrate on which elements are being formed, up through completion of the first etching process of FIG. 4A, is shown in FIG. 6A.

The state of FIG. 6A has the substrate 100, the base insulating film 101 (the base insulating film 101a made of a silicon oxynitride film and the base insulating film 101b made of a silicon oxynitride film), the first through the fourth semiconductor layers 103 to 106, the gate insulating film 107, and the first shape gate electrodes 114 to 117.

A first doping process is performed here. An n-type impurity element is added to the first through the fourth semiconductor layers 103 to 106, forming n-type impurity regions 301 to 304 containing the first concentration of the n-type impurity element, at a low concentration of $1 \times 10^{15}$ to $1 \times 10^{17}/cm^3$.

A second etching process is performed next. The first shape gate electrodes 114 to 117 (composed of the first electrodes 114a to 117a and the second electrodes 114b to 117b) are etched, forming second shape gate electrodes 305 to 308 (composed of electrodes (A) 305a to 308a and electrodes (B) 305b to 308b).

After completing the process steps up through this point, manufacturing proceeds similarly to Embodiment 1 from the second doping process shown by FIG. 4C, and the active matrix substrate like that shown in FIG. 5C can be manufactured.

Embodiment 3

An embodiment of a method of manufacturing a semiconductor film used in an active layer in Embodiment 1 or Embodiment 2 is explained using FIGS. 7A to 7E. In this method, a metallic element having a catalytic action is added to the entire surface of a semiconductor film having an amorphous structure, crystallization is performed, and then gettering is performed.

A high field effect mobility can be obtained by using the semiconductor film having good crystallinity obtained by the method disclosed in Embodiment 3 as an active layer, and a TFT having high reliability can be manufactured.

Figure 7A:
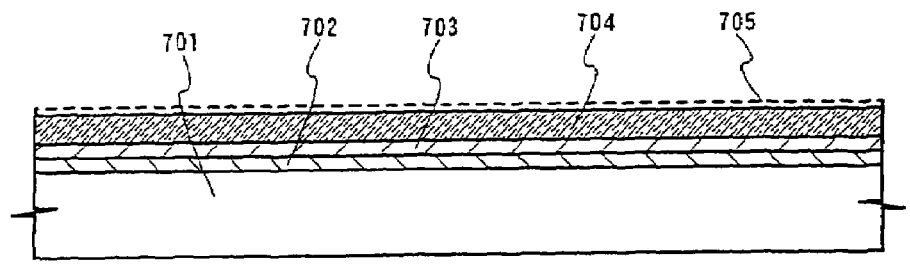
FIGS. 7A to 7E are diagrams showing an example of an embodiment of the present invention.

There are no particular limitations placed on the material of a substrate 701 in FIG. 7A, but preferably a material such as barium borosilicate glass, aluminum borosilicate glass, or quartz can be used. A first silicon oxynitride film 702 manufactured by plasma CVD from $SiH_4$, $NH_3$, and $N_2O$ with a thickness of 50 nm, and a second silicon oxynitride film 703 manufactured from $SiH_4$ and $N_2O$ with a thickness of 100 mm, are formed on the surface of the substrate 701 as base insulating films. The base insulating films are formed so that alkaline metals contained in the glass substrate do not diffuse within semiconductor films formed on the substrate, and it is possible to omit the base insulating films if quartz is used for the substrate.

A semiconductor material having silicon as its main constituent is used for a semiconductor film 704 having an amorphous structure formed on the base insulating film. A film such as an amorphous silicon film or an amorphous silicon germanium film is typically applied, and formed having a thickness of 10 to 100 nm by plasma CVD, reduced pressure CVD, or sputtering. The concentration of impurities such as oxygen and nitrogen contained in the amorphous semiconductor film 704 may be reduced to a level equal to, or less than, $5\times10^{18}/cm^3$ in order to obtain good crystals. These impurities become primary factors hindering crystallization of the amorphous semiconductor, and further, cause the density of capture centers and recrystallization centers to increase. It is therefore preferable to use very high purity material gasses, and also to use a CVD apparatus corresponding to an extremely high vacuum, in which the inside of the reaction chamber has undergone mirror surface processing (field polishing processing), and which is prepared with an oil free vacuum evacuation system.

A metallic element that has a catalytic action for promoting crystallization is then added to the surface of the amorphous semiconductor film 704. One element, or a plurality of elements, selected from the group consisting of iron (Fe), nickel (Ni), cobalt (Co), ruthenium (Ru), rhodium (Rh), palladium (Pd), osmium (Os), iridium (Ir), platinum (Pt), copper (Cu), gold (Au) and the like can be used as the metallic element that has a catalytic action for promoting crystallization of the semiconductor film. Nickel is typically used, and a catalyst containing layer 705 is formed by applying a nickel acetate salt solution, containing from 1 to 100 ppm nickel by weight, using a spinner. In this case, an extremely thin oxidized film may be formed from an ozone containing aqueous solution as a surface preparation of the amorphous structure semiconductor film 704 in order to increase the wetting of the liquid. A clean surface is formed after etching the oxide film using a mixed solution of hydrogen fluoride and hydrogen peroxide, and an extremely thin oxide film is formed once again by processing with an ozone containing aqueous solution. The surface of semiconductor films such as silicon is initially hydrophobic, and therefore a uniform application of the nickel acetate salt solution can be achieved by forming the oxide film.

The catalyst containing layer 705 is of course not limited to this type of method, and may also be formed using sputtering, evaporation, plasma processing, and the like. Furthermore, the catalyst containing layer 705 may also be formed before forming the amorphous structure semiconductor film 704, that is the catalyst containing layer 705 may be formed on the base insulating film.

Heat treatment is performed for crystallization while maintaining the state in which the amorphous structure semiconductor film 704 and the catalytic element containing layer 705 are in contact. A furnace annealing method using an electric oven, or a rapid thermal annealing (hereafter referred to as RTA) method using a heat source such as a halogen lamp, a metal halide lamp, a xenon arc lamp, a carbon arc lamp, a high pressure sodium lamp, or a high pressure mercury lamp is employed as the heat treatment method. Considering productivity, RTA can be thought of a preferable method to be employed.

Figure 7B:
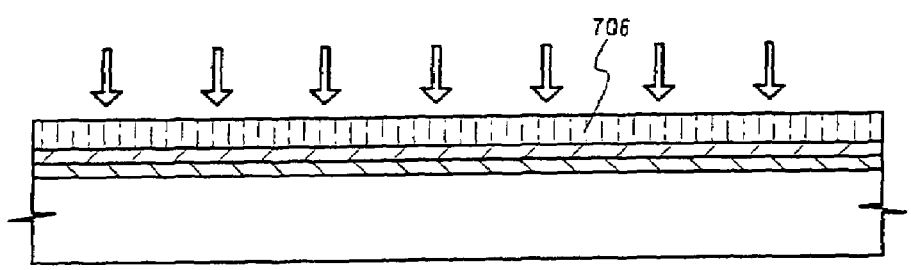

A heat treatment lamp light source is turned on for 1 to 60 seconds, preferably for 30 to 60 seconds, and this is repeated between 1 and 10 times, preferably between 2 and 6 times, when performing the RTA method. The intensity of light emitted from the lamp light source may be arbitrarily set, but it is preferable to set the intensity such that the semiconductor film is instantaneously heated to between 600 and 1000° C., preferably from 650 to 750° C. Even with this high temperature, the semiconductor film is only heated instantaneously, and therefore the substrate 100 itself does not distort and change in shape. The amorphous semiconductor film can thus be crystallized, and a semiconductor film 706 having a crystalline structure can thus be obtained as shown in FIG. 7B. Crystallization by this type of process was first achieved by forming the catalytic containing layer.

If furnace annealing is used as another method of crystallization, then heating is performed at 500° C. for on the order of 1 hour as a preprocess to heat treatment in order to release hydrogen contained in the amorphous structure semiconductor film 704. Heat treatment is then performed within a nitrogen atmosphere using an electric furnace at a temperature of 550 to 600° C., preferably at 580° C. for four hours, crystallizing the amorphous structure silicon film 704. The crystalline structure silicon film 706 shown in FIG. 7B is thus formed.

In addition, irradiation of laser light to the crystalline structure silicon film 706 is effective for increasing the crystallinity (the proportion of crystal components in the entire volume of the film) and for repairing defects remaining within crystal grains. Excimer laser light having a wavelength equal to or less than 400 nm, and the second harmonic and the third harmonic of a YAG laser may be used. Whichever laser is employed, pulse laser light having a repetition frequency of approximately 10 to 1000 Hz is used, and the laser light is condensed by an optical system so as to have a power density of 100 to 400 $mJ/cm^2$. Laser processing may then be performed on the crystalline structure semiconductor film 706 while using an overlap ratio of 90 to 95%.

The catalytic element (nickel here) remains in the crystalline structure semiconductor film 706 thus obtained. The distribution is not uniform throughout the film, but the catalytic element with a concentration that exceeds $1\times10^{19}/cm^3$ in average remains in the crystalline structure semiconductor film 706. It is of course possible to form various types of semiconductor elements, such as TFTs, in this state, but the catalytic element is removed by gettering in accordance with the process shown below.

Figure 7C:
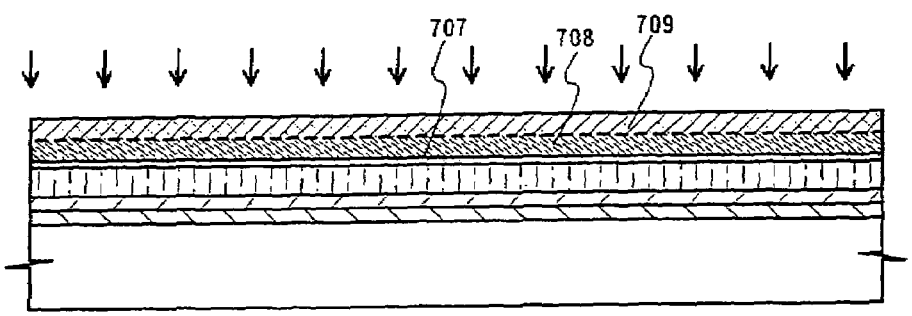
Figure 7D:
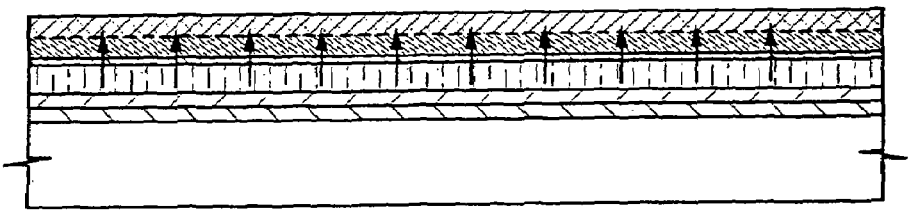

First, a thin barrier layer 707 is formed in the surface of the crystalline structure semiconductor film 706 as shown in FIG. 7C. There are no particular limitations placed on the thickness of the barrier layer 707, and chemical oxide formed simply by aqueous ozone processing may also be substituted. Further, chemical oxide can also be similarly formed by processing with an aqueous solution in which acid such as sulfuric acid, hydrochloric acid, or nitric acid is mixed with hydrogen peroxide. Plasma processing within an oxygen atmosphere, or oxidation processing by generating ozone due to the irradiation of ultraviolet light within an oxygen containing atmosphere may also be performed as other methods of forming the barrier layer. In addition, a thin oxide film formed by heating at a temperature of 200 to 350° C. using a clean oven may also be used as the barrier layer. Alternatively, an oxide film having a thickness on the order of 1 to 5 nm may also be deposited as the barrier layer by using a method such as plasma CVD, sputtering, or evaporation.

A semiconductor film 708 is then formed having a thickness of 25 to 250 nm on the barrier layer by plasma CVD or sputtering. Typically, an amorphous silicon film containing from 0.01 to 20 atomic % of argon is formed by sputtering using argon. The semiconductor film 708 is later removed, and therefore it is preferable to use a low density film in order to increase its selectivity with the crystalline structure semiconductor film 706 during etching. Gettering sites can be formed if an inert gas element is added within the amorphous silicon film, and an inert gas element is similarly placed throughout the film.

One element, or a plurality of elements, chosen from the group consisting of helium (He), neon (Ne), argon (Ar), krypton (Kr), and xenon (Xe) are used as the inert gas element. The inert gas element is used as an ion source in order to form gettering sites in the present invention, and the inert gas element is injected into the semiconductor film by ion doping or ion injection. There are two reasons for injecting the ions of the inert gas element. One is that dangling bonds are formed by injection, imparting distortion to the semiconductor film, and the other reason is that the ions are injected within the semiconductor film lattice, also imparting distortion. Injection of the inert gas ions can satisfy both the reasons at the same time, but in particular, remarkable results can be obtained due to the latter reason when using elements having a larger atomic size than silicon, such as argon (Ar), krypton (Kr), and xenon (Xe).

It becomes necessary to perform heat treatment afterward in order to achieve gettering with certainty. Furnace annealing or RTA is performed for the heat treatment. When furnace annealing is used, heat treatment is performed for 0.5 to 12 hours at a temperature of 450 to 600° C. in a nitrogen atmosphere. Further, if RTA is used, a heating lamp light source is turned on for 1 to 60 seconds, preferably from 30 to 60 seconds, and this is repeated between 1 and 10 times, preferably between 2 and 6 times. The intensity of the light emitted from the lamp light source may be arbitrarily set, but processing is performed such that the semiconductor film is heated instantaneously to a temperature of 600 to 1000° C., preferably to a temperature between 700 and 750° C.

During gettering, the catalytic elements in regions to be gettered (capture sites) are released by thermal energy, and then move to the gettering sites by diffusion. Gettering therefore depends on the processing temperature, and the time needed for gettering to proceed becomes shorter as the processing temperature becomes higher. As shown by the arrow in FIG. 7E, there is a distance on the order of the thickness of the semiconductor film in the movement direction for the catalytic elements, and therefore gettering can be accomplished in a relatively short period of time.

Note that the semiconductor film 708 containing the inert gas elements at a concentration equal to or greater than $1 \times 10^{20}/cm^3$, is not crystallized by this heat treatment. This is thought to be because the inert gas elements are not released again and remain within the film in the above stated processing temperature range, thus inhibiting crystallization of the semiconductor film.

Thereafter, the amorphous semiconductor film 708 is then selectively etched and removed. Dry etching by $ClF_3$ not using plasma, and wet etching by an alkaline solution such as an aqueous solution containing hydrazine or tetraethyl ammonium hydroxide (chemical formula $(CH_3)_4NOH$) can be used as etching methods. The barrier layer 707 functions as an etching stopper at this time. Further, the barrier layer 707 may be removed later by using hydrofluoric acid.

Figure 7E:
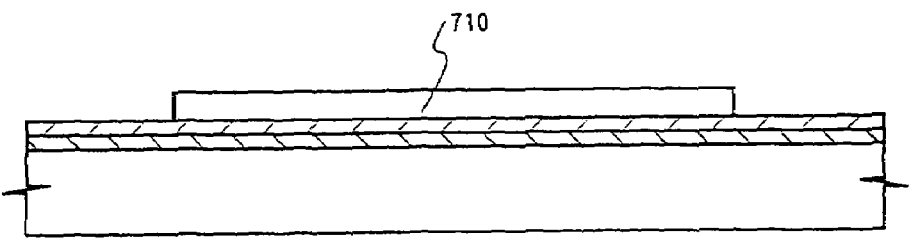

A semiconductor film 710 having a crystalline structure and in which the concentration of the catalytic element is lowered to be equal to, or less than, $1 \times 10^{17}/cm^3$, can thus be obtained as shown in FIG. 7E. The crystalline structure semiconductor film 710 thus formed is one in which thin rod shape or thin flattened rod shape crystals are formed due to the catalytic element action, and crystal growth is such that there is a specific directionality present in each of the crystals when viewed macroscopically. The crystalline structure semiconductor film 710 manufactured in Embodiment 3 can be applied to the semiconductor films shown in Embodiment 1 or 2.

Embodiment 4

Figure 8A:
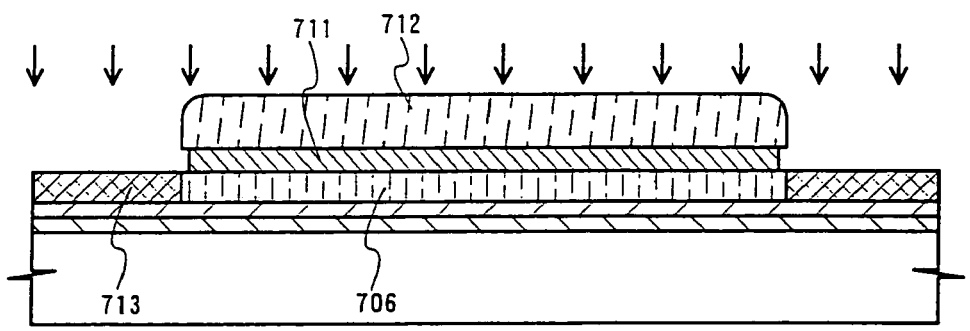
FIGS. 8A to 8C are diagrams showing an example of an embodiment of the present invention.
Figure 8B:
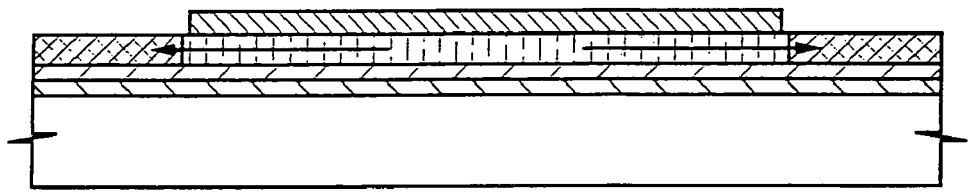
Figure 8C:
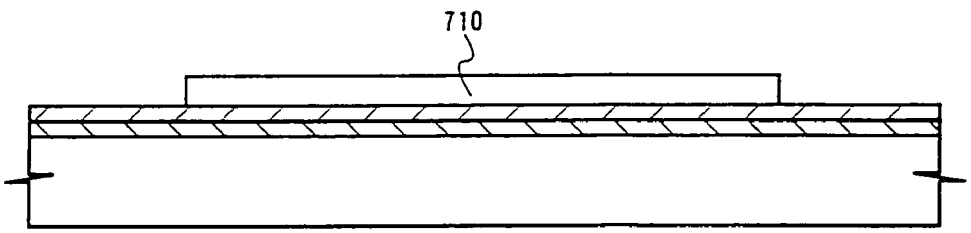

Another method of gettering the catalytic elements remaining in the crystalline structure semiconductor film 706 obtained in Embodiment 3 is shown in FIGS. 8A to 8C. A silicon oxide film as a mask is formed having a thickness of 150 nm on the crystalline structure semiconductor film 706, and a resist mask 712 is formed. A mask insulating film 711 is next obtained by etching the silicon oxide film. A noble gas element, or a noble gas element and phosphorous, or just phosphorous is then injected into the crystalline semiconductor film 706 by ion doping, forming gettering sites 713.

Heat treatment is then performed by furnace annealing within a nitrogen atmosphere at 450 to 600° C. for 0.5 to 12 hours, as shown in FIG. 8B. The catalytic element remaining in the crystalline structure semiconductor film 706 can thus be moved to the gettering sites 713 and concentrated.

The crystalline structure semiconductor film 710 can then be obtained by removing the mask insulating film 711 and the gettering sites by etching. The crystalline structure semiconductor film 710 manufactured by Embodiment 4 can be applied to the semiconductor films shown by Embodiments 1 and 2.

Embodiment 5

Figure 9:
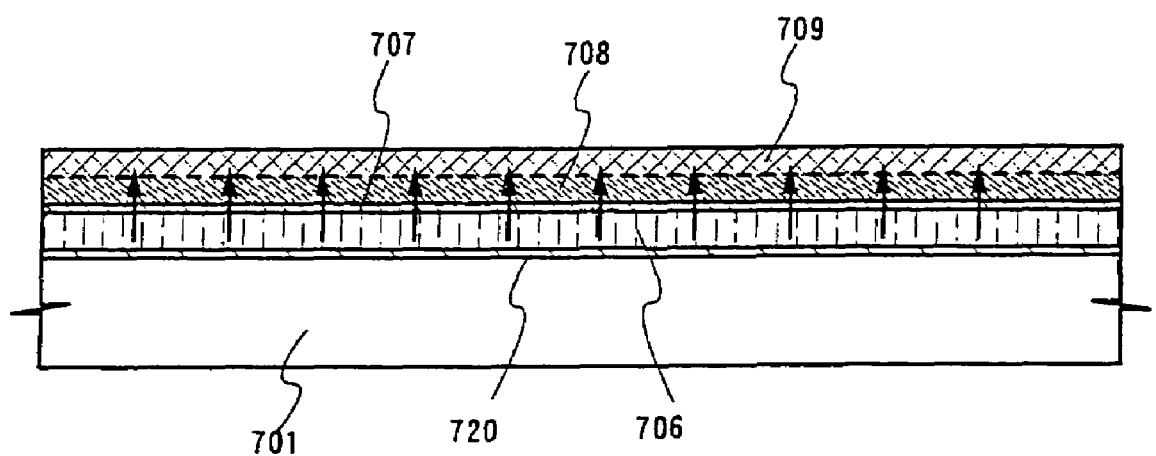
FIG. 9 is a diagram showing an example of an embodiment of the present invention.

A 1 to 10 nm thick silicon nitride film can also be used as the base insulating film formed on the substrate 701 in Embodiment 3. FIG. 9 shows a state in which the crystalline structure semiconductor film 706, the barrier layer 707, the semiconductor film 708, and the semiconductor film 709 into which a noble gas element is added have been manufactured by processes similar to those of Embodiment 3, using such a silicon nitride film as a base insulating film 720, after which gettering has been performed by heat treatment. A catalytic element such as nickel has a quality of being captured by oxygen or in the vicinity of oxygen. The catalytic element can therefore be moved easily from the crystalline structure semiconductor film 706 to the semiconductor film 708, or to the semiconductor film 709 to which the inert gas element has been added, by forming the base insulating film from a silicon nitride film. The semiconductor films can be applied to the semiconductor films shown in Embodiments 1 and 2.

Embodiment 6

A case of using a semiconductor film (typically silicon), obtained by heat treatment at a high temperature, in a semiconductor layer containing a channel forming region, a source region, and a drain region is explained in Embodiment 6. (The semiconductor film is hereafter referred to as a high temperature polysilicon film.)

An amorphous semiconductor film is formed on a quartz substrate having high heat resistivity by using PECVD. Heat treatment is performed next for 24 hours at a temperature of 600° C. using a furnace, forming a crystalline semiconductor film. Note that a silicon oxide film is formed on the semiconductor film surface during this crystallization process, but this does not pose any problems because the silicon oxide film is an extremely thin film that can be removed by a process such as etching.

The oxide film formed on the surface of the crystalline semiconductor film is removed next, and then heat treatment for forming a gate insulating film is performed. The crystalline semiconductor film is heat treated at a temperature of 900 to 1050° C., and an oxide film is formed on the surface of the crystalline semiconductor film. This silicon oxide film is used as the gate insulating film. A silicon oxide film may then be formed on the surface of the crystalline semiconductor film by performing heat treatment of the crystalline semiconductor film such that the final film thickness of the crystalline semiconductor film becomes 30 to 50 nm.

The semiconductor film thus obtained by high temperature heat treatment has good crystallinity and a high electric field effect mobility. TFTs having superior characteristics can be achieved by using the semiconductor film in a semiconductor layer containing a channel forming region, a source region, and a drain region. In addition, a semiconductor device having high reliability can be realized by using the TFTs in circuits. It is possible to combine Embodiment 6 with Embodiments 1 and 2.

Embodiment 7

Figure 15:
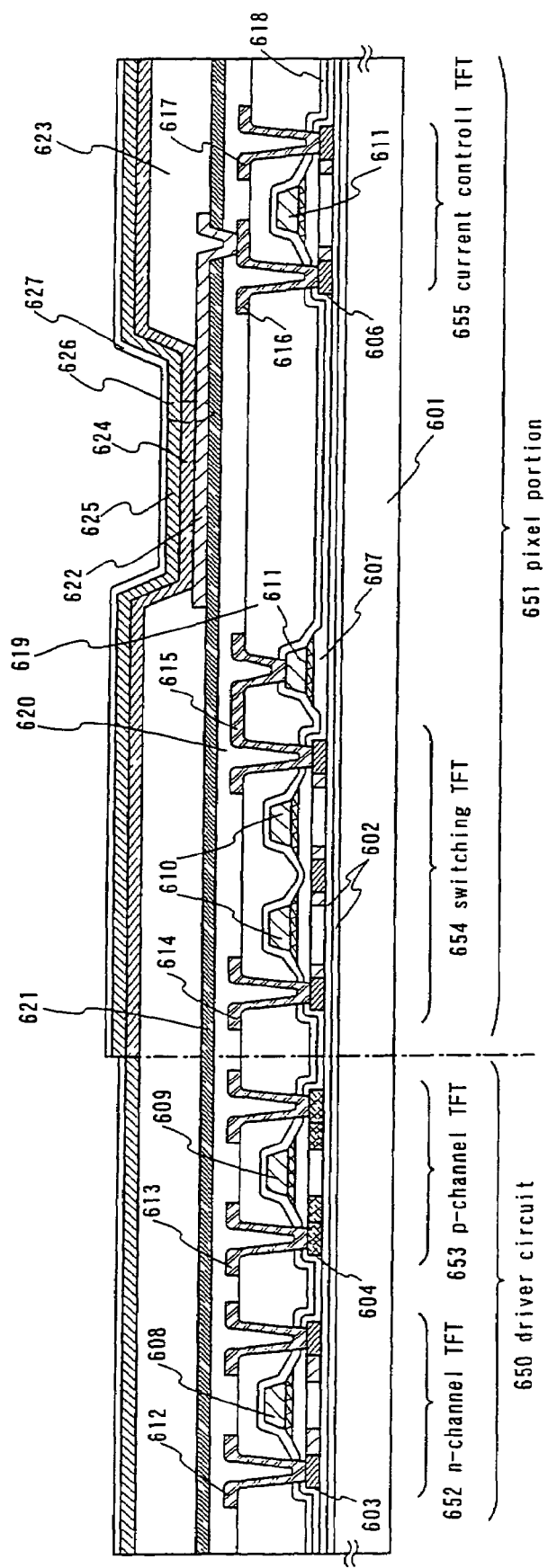
FIG. 15 is a diagram showing an example of a light emitting element manufactured by applying the present invention.

An example of a process of manufacturing a light emitting device is explained in Embodiment 7 using FIG. 15.

FIG. 15 is an example showing the structure of an active matrix drive light emitting device. An n-channel TFT 652 and a p-channel TFT 653 of a drive circuit portion, and a switching TFT 654 and an electric current control TFT 655 of a pixel portion 651 shown here are manufactured by processes similar to those of Embodiment 1 according to the present invention.

A first interlayer insulating film 618 made from silicon nitride or silicon oxynitride is formed on gate electrodes 608 to 611, and is used as a protective film. In addition, a second interlayer insulating film 619 made from an organic resin material such as polyimide or acrylic is formed as a leveling film.

The circuit structure of the driver circuit portion 650 differs between a gate signal line driver circuit and a data signal line driver circuit, but this is omitted here. Wirings 612 and 613 are connected to the n-channel TFT 652 and to the p-channel TFT 653, and circuits such as shift registers, latch circuits, and buffer circuits are formed by using those TFTs.

In the pixel portion 651, a data wiring 614 is connected to a source side of the switching TFT 654, and a drain side wiring 615 is connected to the gate electrode 611 of the electric current control TFT 655. Further, a source side of the electric current control TFT 655 is connected to an electric power source supply wiring 617, and a drain side electrode 616 is connected to an anode of a light emitting element.

A first interlayer insulating film 618 is then formed, and a second interlayer insulating film 619 is formed next. An inorganic insulating material may be formed having an average film thickness from 1.0 to 2.0 μm as the second interlayer insulating film 619. A silicon oxide film or a silicon oxynitride film may be formed as an inorganic resin film using a known sputtering method or plasma CVD method. In addition, the inorganic resin film may be formed by plasma CVD using $SiH_4$ and $N_2O$ as raw material gasses if a silicon oxynitride film is used, with film deposition conditions of a pressure of 0.3 torr, a substrate temperature of 400° C., an RF output of 100 W, and raw material gas flow rates of 4 sccm and 400 sccm for $SiH_4$ and $N_2O$, respectively. Further, an SOG film may also be used as the second interlayer insulating film 619. In addition, the second interlayer insulating film 619 may also be manufactured using an organic insulating film such as acrylic.

Note that it is preferable to polish and level the surface of the second interlayer insulating film 619, by using a technique referred to as CMP (chemical mechanical polishing) for cases in which the second interlayer insulating film 619 is manufactured using an inorganic insulating film. CMP is a method in which a surface of a workpiece to be polished is taken as a standard, and chemical and mechanical leveling is performed on the surface. In general, a polishing cloth or a polishing pad (hereafter referred to as a pad in this specification) is attached to a platen or a polishing plate. The platen or polishing plate, and the piece to be polished, are then each rotated or oscillated while a slurry is supplied between the workpiece and the polishing pad. Processing of the surface of a polishing agent is thus performed by a compound chemical and mechanical action. Note that polishing is performed such that the average film thickness of the second interlayer insulating film 619 is set on the order of 1.0 to 2.0 μm after the leveling process by CMP is complete.

A third insulating film 620 and a fourth insulating film 621 are then formed. The fourth insulating film 621 made from silicon nitride or silicon oxynitride fulfills a role of protecting the semiconductor film that is the main structural element of the TFT from contamination by alkaline metals or organic substances contained within an organic compound layer 624, as well as protecting the organic compound layer 624 from degradation due to oxygen and moisture.

A transparent conductive film having a thickness of 80 to 120 nm is formed next on the fourth insulating film 621, and an anode 622 is formed by etching. Note that an indium tin oxide (ITO) film or a transparent conductive film in which indium oxide is mixed with 2 to 20% zinc oxide (ZnO), is used as a transparent electrode in Embodiment 7.

In order to form a barrier layer 623 which covers edge portions of the anode 622, a film of a material such as resist, polyimide, polyamide, acrylic, BCB (benzocyclobutene), or silicon oxide is formed. Provided that the barrier layer has insulating properties, both organic and inorganic materials may be used. Note that if a photosensitive acrylic is used to form the barrier layer, it is preferable to perform heat treatment at a temperature of 180 to 350° C. after etching a film of the photosensitive acrylic. Furthermore, it is preferable to perform heat treatment at a temperature of 180 to 350° C. and then to perform etching, forming the barrier layer 623, if the barrier layer is formed using a non-photosensitive acrylic film. The barrier layer may be formed by a method such as CVD if a silicon oxide film is used.

An organic compound layer 624 and a cathode 625 are then formed by evaporation on the anode 622 and the barrier layer 623. Note that although an MgAg electrode is used as the cathode of the light emitting elements in Embodiment 7, other known materials may also be used. In addition, the organic compound layer 624 may be formed by combining and laminating a plurality of layers, such as a hole injecting layer, a hole transporting layer, an electron transporting layer, an electron injecting layer, and a buffer layer, in addition to a light emitting layer. The detailed structure of the organic compound layer 624 may be arbitrarily determined.

An organic light emitting element 626 composed of the anode 622, the organic compound layer 624, and the cathode 625 is thus formed.

A fifth insulating film 627 is then formed of an insulating film such as a DLC film. A light emitting device in which the barrier layer has a tapered shape can thus be manufactured as shown in FIG. 15.

The semiconductor device of the present invention, capable of achieving both a low leak current and a high on current, in which the TFT size is reduced, can be particularly effective when applied to a light emitting device in which a switching TFT and an electric current control TFT, at least two TFTs are formed within one pixel, and a reduction in the aperture ratio (lower brightness, lower light emission efficiency) is a problem.

Embodiment 8

The active matrix liquid crystal display device (liquid crystal display device) formed by executing the present invention can be used in the display portion of various electric equipments.

The following can be given as such electric equipment using the liquid crystal display device in the display portion: a video camera, a digital camera, a projector (rear type or front type), a head mounted display (goggle type display), a personal computer, and a portable information terminal (such as a mobile computer, a portable telephone, or an electronic book). Some examples of these are shown in FIGS. 11A to 13C.

FIG. 11A shows a personal computer, which contains components such as a main body 2001, an image input portion 2002, a display portion 2003, and a keyboard 2004.

FIG. 11B shows a video camera, which contains components such as a main body 2101, a display portion 2102, an audio input portion 2103, operation switches 2104, a battery 2105, and an image receiving portion 2106.

FIG. 11C shows a mobile computer, which contains components such as a main body 2201, a camera portion 2202, an image receiving portion 2203, operation switches 2204, and a display portion 2205.

FIG. 11D shows a goggle type display, which contains components such as a main body 2301, a display portion 2302, and arm portions 2303.

FIG. 11E shows a player which uses a recording medium with a program recorded therein (hereinafter referred to as a recording medium), which contains components such as a main body 2401, a display portion 2402, a speaker portion 2403, a recording medium 2404, and operation switches 2405. Note that a DVD (digital versatile disk) or CD (compact disk) is used as the recording medium for this player, and that appreciation of music or a movie or performing games or the Internet can be done.

FIG. 11F shows a digital camera, which contains components such as a main body 2501, a display portion 2502, an eye piece portion 2503, operation switches 2504, and an image receiving portion (not shown in the figure).

Figure 12A:
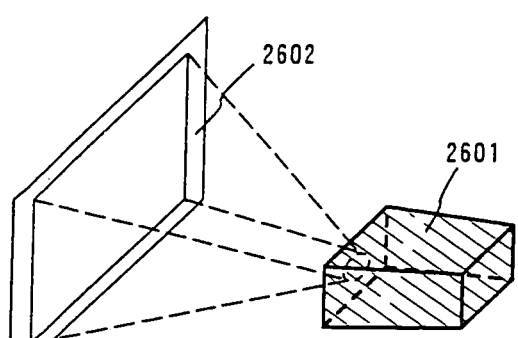
FIGS. 12A to 12D are diagrams showing examples of electric equipment.

FIG. 12A shows a front type projector, which contains components such as a projecting apparatus 2601 and a screen 2602.

Figure 12B:
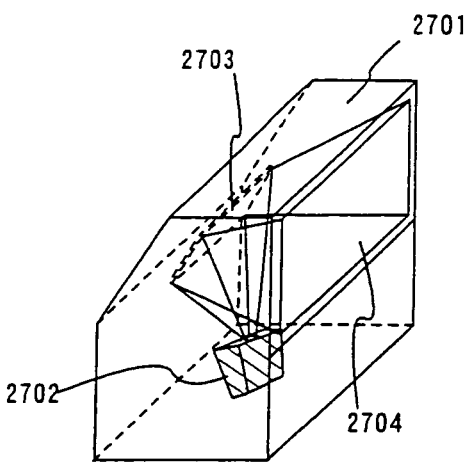
Figure 12C:
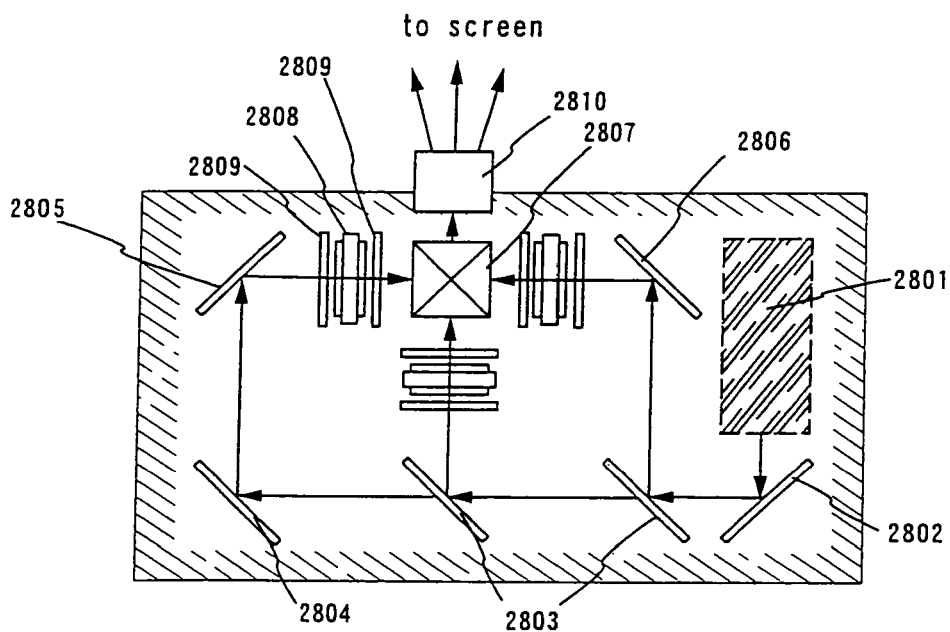

FIG. 12B shows a rear type projector, which contains components such as a main body 2701, a projecting apparatus 2702, a mirror 2703, and a screen 2704. Note that an example of the structure of the projecting apparatuses 2601 and 2702 of FIG. 12A and FIG. 12B is shown in FIG. 12C. The projecting apparatuses 2601 and 2702 are each composed of a light source optical system 2801, mirrors 2802 and 2804 to 2806, a dichroic mirror 2803, a prism 2807, the liquid crystal display device 2808, a phase difference plate 2809, and a projecting optical system 2810. The projecting optical system 2810 is composed of an optical system including a projection lens. A three-plate type example is shown in Embodiment 8, but there are no particular limitations, and a single-plate type may also be used, for example. Further, optical systems such as an optical lens, a film having a light polarizing function, a film for regulating the phase difference, and an IR film may be suitably placed in the optical path shown by the arrow in FIG. 12C by the operator.

Figure 12D:
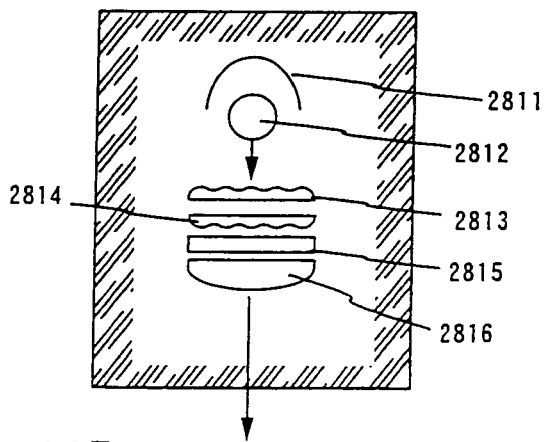

Furthermore, FIG. 12D is a diagram showing one example of the light source optical system 2801 in FIG. 12C. In Embodiment 8, the light source optical system 2801 is composed of a reflector 2811, a light source 2812, lens arrays 2813 and 2814, a polarizing conversion element 2815, and a condenser lens 2816. Note that the light source optical system shown in FIG. 12D is one example, and the light source optical system is not limited to the structure shown in the figure. For example, optical systems such as an optical lens, a film having a light polarizing function, a film for regulating the phase difference, and an IR film may be suitably added to the light source optical system by the operator.

Note that a case using a transmitting type electro-optical device in the projectors shown in FIG. 12A is shown here, and examples of applying a reflecting type liquid crystal display device is not shown in the figures.

Figure 13A:
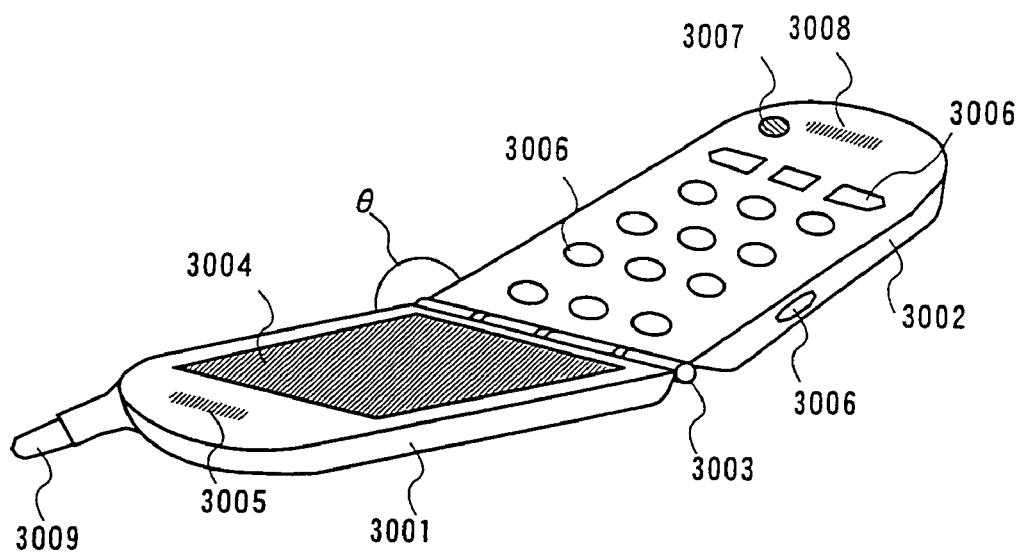
FIGS. 13A to 13C are diagrams showing examples of electric equipment.

FIG. 13A shows a portable telephone, and reference numerals 3001 and 3002 denote a display panel and an operation panel, respectively. The display panel 3001 and the operation panel 3002 are connected through a connecting portion 3003. In the connecting portion 3003, an angle θ formed by the surface on which a display portion 3004 of the display panel 3001 is provided and the surface on which operation keys 3006 of the operation panel 3002 are provided can be arbitrarily changed. Further, the portable telephone includes an audio output portion 3005, the operation keys 3006, a power source switch 3007, and an audio input portion 3008.

Figure 13B:
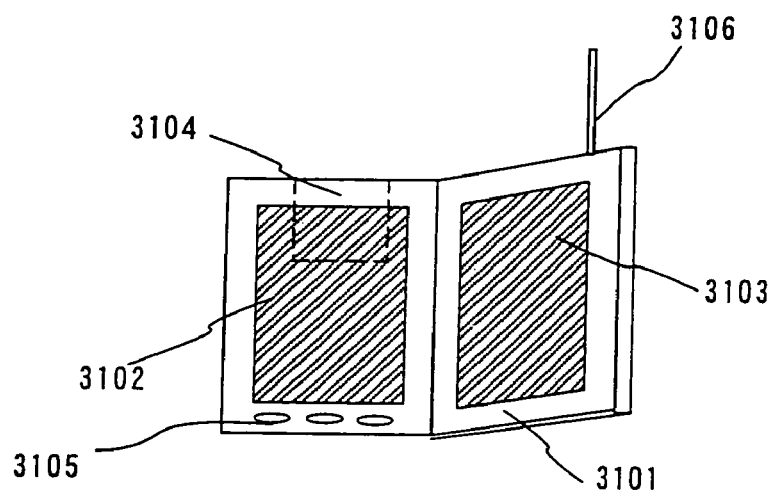

FIG. 13B shows a portable book (electronic book), which contains components such as a main body 3101, display portions 3102 and 3103, a recording medium 3104, operation switches 3105, and an antenna 3106.

Figure 13C:
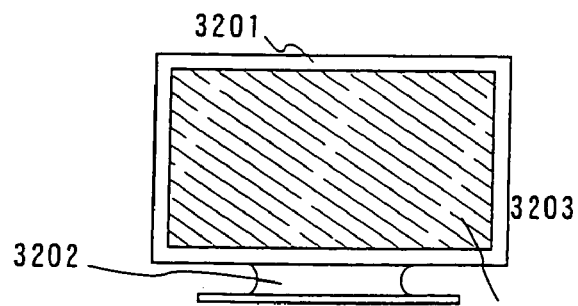
Figure 14A:
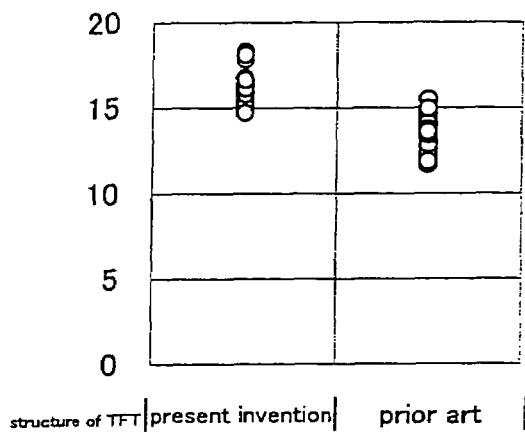
FIGS. 14A to 14D are diagrams showing the results of comparing the electrical characteristics between a semiconductor device of the present invention and an example of a conventional semiconductor device.
Figure 14B:
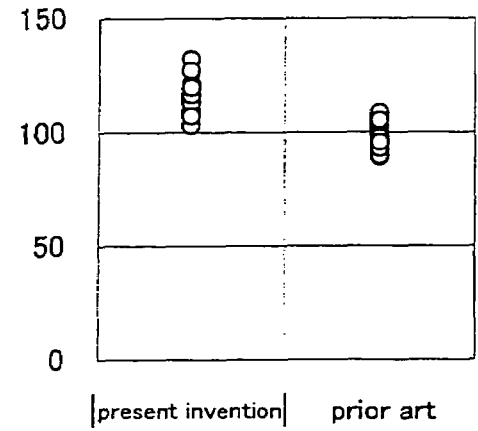
Figure 14C:
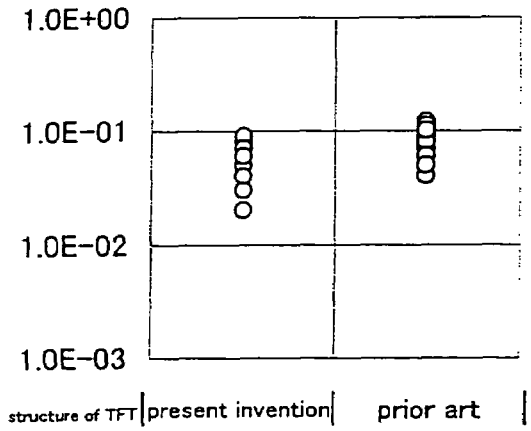
Figure 14D:
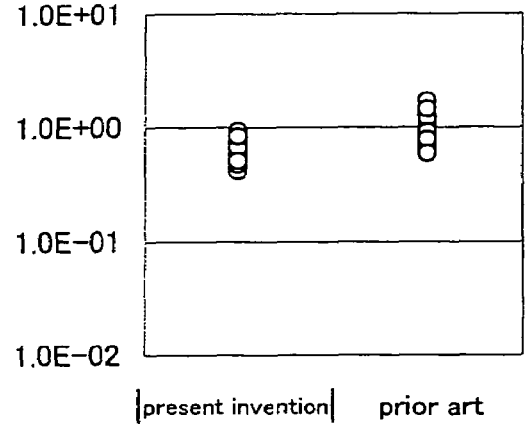

FIG. 13C shows a display, which contains components such as a main body 3201, a support stand 3202, and a display portion 3203. The display of the present invention is advantageous for cases of large size screens in particular, and is advantageous for displays having a diagonal equal to or greater than 10 inches (in particular, equal to or greater than 30 inches).

The applicable range of the present invention is thus extremely wide, and the present invention can be applied to electronic equipment of all fields. Furthermore, the electronic equipment in this embodiment can be realized by using a liquid crystal display device formed by using an active matrix substrate formed in accordance with any combination of Embodiments 1 to 5.

TFTs having good electrical characteristics without enlarging the size of their active layers can be manufactured in accordance with the present invention. In particular, the present invention is effective for manufacturing present day liquid crystal display devices in which a high aperture ratio is sought by increasing the number of pixels and reducing the pixel size for achieving high image quality.

Furthermore, TFTs corresponding to the performance demanded by various types of circuits can be made separately, without increasing the number of manufacturing process steps, in accordance with the present invention. The operational characteristics of the active matrix substrate can be improved.

What is claimed:

1. A method of manufacturing a semiconductor device, comprising the steps of:
    forming a semiconductor layer on an insulating surface;
    forming a gate insulating film on the semiconductor layer;
    forming a first conductive film and a second conductive film on the gate insulating film;
    etching the first conductive film and the second conductive film,
    forming a first shape gate electrode composed of a first electrode and a second electrode on the semiconductor layer;
    etching the first electrode and the second electrode, forming a second shape gate electrode composed of a third electrode and a fourth electrode;
    adding an n-type impurity element to the semiconductor layer in a self aligning manner with the second shape gate electrode as a mask, forming an n-type impurity region containing a first concentration of the n-type impurity element;
    forming a mask covering a portion of the semiconductor layer; and
    forming on the semiconductor layer:
    an n-type impurity region containing a second concentration of the n-type impurity element, adjacent to a channel forming region through the third electrode; an n-type impurity region containing a third concentration of the n-type impurity element, adjacent to the n-type impurity region containing the first concentration of the n-type impurity element; and
    an n-type impurity region containing the third concentration of the n-type impurity element, adjacent to the n-type impurity region containing the second concentration of the n-type impurity element.

2. A method of manufacturing a semiconductor device, comprising the steps of:
    forming a first semiconductor layer, a second semiconductor layer, a third semiconductor layer, and a fourth semiconductor layer on an insulating surface;
    forming a gate insulating film on the first through the fourth semiconductor layers;
    forming a first conductive film and a second conductive film on the gate insulating film;
    etching the first conductive film and the second conductive film, forming a first shape gate electrode, composed of a first electrode and a second electrode, on the first through the fourth semiconductor layers;
    etching the first electrode and the second electrode, forming a second shape gate electrode, composed of a, third electrode and a fourth electrode;
    adding an n-type impurity element to the first through the fourth semiconductor layers in a self aligning manner, with the second shape gate electrode as a mask, forming an n-type impurity region containing a first concentration of the n-type impurity element;
    forming a first mask covering all of the second semiconductor layer and all of the fourth semiconductor layer, and forming a second mask covering a portion of the third semiconductor layer;
    forming a second concentration impurity region through the third electrode with the fourth electrode on the first semiconductor layer as a mask, and an n-type impurity region containing a third concentration of the n-type impurity element, in the first semiconductor layer;
    forming an n-type impurity region containing a second concentration of the n-type impurity element through the third electrode with the fourth electrode and the second mask as a mask, and an n-type impurity region containing the third concentration of the n-type impurity element, in the third semiconductor layer;
    forming a third mask covering the first semiconductor layer and the third semiconductor layer; and
    adding a p-type impurity element to the second semiconductor layer and to the fourth semiconductor layer, forming a p-type impurity region containing a first concentration of the p-type impurity element, and a p-type impurity region containing a second concentration of the p-type impurity element.

3. A method of manufacturing a semiconductor device comprising the steps of:
    forming a first semiconductor layer, a second semiconductor layer, a third semiconductor layer, and a fourth semiconductor layer on an insulating surface;
    forming a gate insulating film on the first through the fourth semiconductor layers;
    forming a first conductive film and a second conductive film on the gate insulating film;
    etching the first conductive film and the second conductive film, forming a first shape gate electrode, composed of a first electrode and a second electrode, on the first through the fourth semiconductor layers;
    adding an n-type impurity element to the first through the fourth semiconductor layers with the first shape gate electrode as a mask, forming an n-type impurity region containing a first concentration of the n-type impurity element;
    etching the first electrode and the second electrode, forming a second shape gate electrode, composed of a third electrode and a fourth electrode;
    forming a first mask covering all of the second semiconductor layer and all of the fourth semiconductor layer, and forming a second mask covering a portion of the third semiconductor layer;
    forming a second concentration impurity region through the third electrode with the fourth electrode on the first semiconductor layer as a mask, and forming an n-type impurity region containing a third concentration of the n-type impurity element, in the first semiconductor layer;
    forming an n-type impurity region containing a second concentration of the n-type impurity element through the third electrode with the fourth electrode and the second mask as masks, and forming an n-type impurity region containing the third concentration of the n-type impurity element, in the third semiconductor layer;
    forming a third mask covering the first semiconductor layer and the third semiconductor layer; and
    adding a p-type impurity element to the second semiconductor layer and to the fourth semiconductor layer, forming a p-type impurity region containing a first concentration of the p-type impurity element, and a p-type impurity region containing a second concentration of the p-type impurity element.

4. A method of manufacturing a semiconductor device according to claim 1, wherein:
    the first conductive film comprises: a conductive film made from an element selected from the group consisting of W, Mo, Ta, and Ti; a conductive film made from a chemical compound having one of the elements as its main constituent; or a conductive film made from an alloy having one of the elements as its main constituent.

5. A method of manufacturing a semiconductor device according to claim 2, wherein:

the first conductive film comprises: a conductive film made from an element selected from the group consisting of W, Mo, Ta, and Ti; a conductive film made from a chemical compound having one of the elements as its main constituent; or a conductive film made from an alloy having one of the elements as its main constituent.

6. A method of manufacturing a semiconductor device according to claim 3, wherein:

the first conductive film comprises: a conductive film made from an element selected from the group consisting of W, Mo, Ta, and Ti; a conductive film made from a chemical compound having one of the elements as its main constituent; or a conductive film made from an alloy having one of the elements as its main constituent.

7. A method of manufacturing a semiconductor device according to claim 1, wherein:

the second conductive film comprises: a conductive film made from an element selected from Al and Cu; or is a conductive film made from a chemical compound having one of said elements as its main constituent; or a conductive film made from an alloy having one of the elements as its main constituent.

8. A method of manufacturing a semiconductor device according to claim 2, wherein:

the second conductive film comprises: a conductive film made from an element selected from Al and Cu; or is a conductive film made from a chemical compound having one of said elements as its main constituent; or a conductive film made from an alloy having one of the elements as its main constituent.

9. A method of manufacturing a semiconductor device according to claim 3, wherein:

the second conductive film comprises: a conductive film made from an element selected from Al and Cu; or is a conductive film made from a chemical compound having one of said elements as its main constituent; or a conductive film made from an alloy having one of the elements as its main constituent.

* * * * *